(12) United States Patent
Dodoc

(10) Patent No.: US 7,557,996 B2
(45) Date of Patent: Jul. 7, 2009

(54) PROJECTION OBJECTIVE

(75) Inventor: Aurelian Dodoc, Oberkochen (DE)

(73) Assignee: Carl Zeiss SMT AG, Oberkochen (DE)

( * ) Notice: Subject to any disclaimer, the term of this patent is extended or adjusted under 35 U.S.C. 154(b) by 221 days.

(21) Appl. No.: 11/412,925

(22) Filed: Apr. 28, 2006

(65) Prior Publication Data

US 2006/0256447 A1   Nov. 16, 2006

Related U.S. Application Data

(60) Provisional application No. 60/675,875, filed on Apr. 29, 2005.

(51) Int. Cl.
  *G02B 9/00* (2006.01)
  *G02B 17/00* (2006.01)
(52) U.S. Cl. ............... 359/649; 359/350; 359/726
(58) Field of Classification Search .......... 359/649–651
  See application file for complete search history.

(56) References Cited

U.S. PATENT DOCUMENTS

| | | | |
|---|---|---|---|
| 2002/0024741 A1 | 2/2002 | Terasawa et al. | |
| 2003/0234992 A1 | 12/2003 | Shafer | |
| 2004/0130806 A1 | 7/2004 | Takahashi | |
| 2006/0012885 A1* | 1/2006 | Beder et al. | 359/649 |
| 2006/0198029 A1* | 9/2006 | Schuster | 359/649 |
| 2006/0221456 A1* | 10/2006 | Shafer et al. | 359/649 |

FOREIGN PATENT DOCUMENTS

| | | |
|---|---|---|
| EP | 1 069 448 A1 | 1/2001 |
| EP | 1 336 887 | 7/2004 |
| JP | 2003-114387 A | 4/2003 |
| WO | WO 01/55767 A2 | 8/2001 |
| WO | WO 2004/107011 A1 | 9/2004 |
| WO | WO-2005/059617  * | 6/2005 |
| WO | WO 2005/059617 A2 | 6/2005 |
| WO | 1 630 585 A1 | 3/2006 |

OTHER PUBLICATIONS

U.S. Appl. No. 60/536,248, David Shafer et al.
U.S. Appl. No. 60/544,967, Toralf Gruner et al.
David Lammers, "Doped Water Could Extend 193-nm Immersion Litho", EE Times, Jan. 28, 2004.
David Lammers, "Immersion Effort Looks To New Crystals, Liquids" EE Times, Aug. 16, 2004.
"IMST Immersion Workshop Looks Forward to Manufacturing", European Seminconductor, Jan. 29, 2004.

* cited by examiner

*Primary Examiner*—Jordan M. Schwartz
(74) *Attorney, Agent, or Firm*—Sughrue Mion, PLLC

(57) ABSTRACT

A projection objective for imaging a pattern arranged in an object surface of the projection objective onto an image surface of the projection objective using ultraviolet radiation has a plurality of optical elements including transparent optical elements transparent for radiation at an operating wavelength $\lambda$, where 260 nm>$\lambda$>150 nm, an image-side pupil surface arranged between the object surface and the image surface, and an aperture-defining lens group arranged between the image-side pupil surface and the image surface for converging radiation coming from the image-side pupil surface towards the image surface to define an image-side numerical aperture NA, where $0.7 \leq NA \leq 1.4$. The aperture-defining lens group includes at least one high-index lens made from a transparent high-index material having a refractive index $n_{HI}$, where $n_{HI} > n_{SiO2}$ and where $n_{SiO2}$ is the refractive index of silicon dioxide ($SiO_2$) at the operating wavelength.

31 Claims, 12 Drawing Sheets

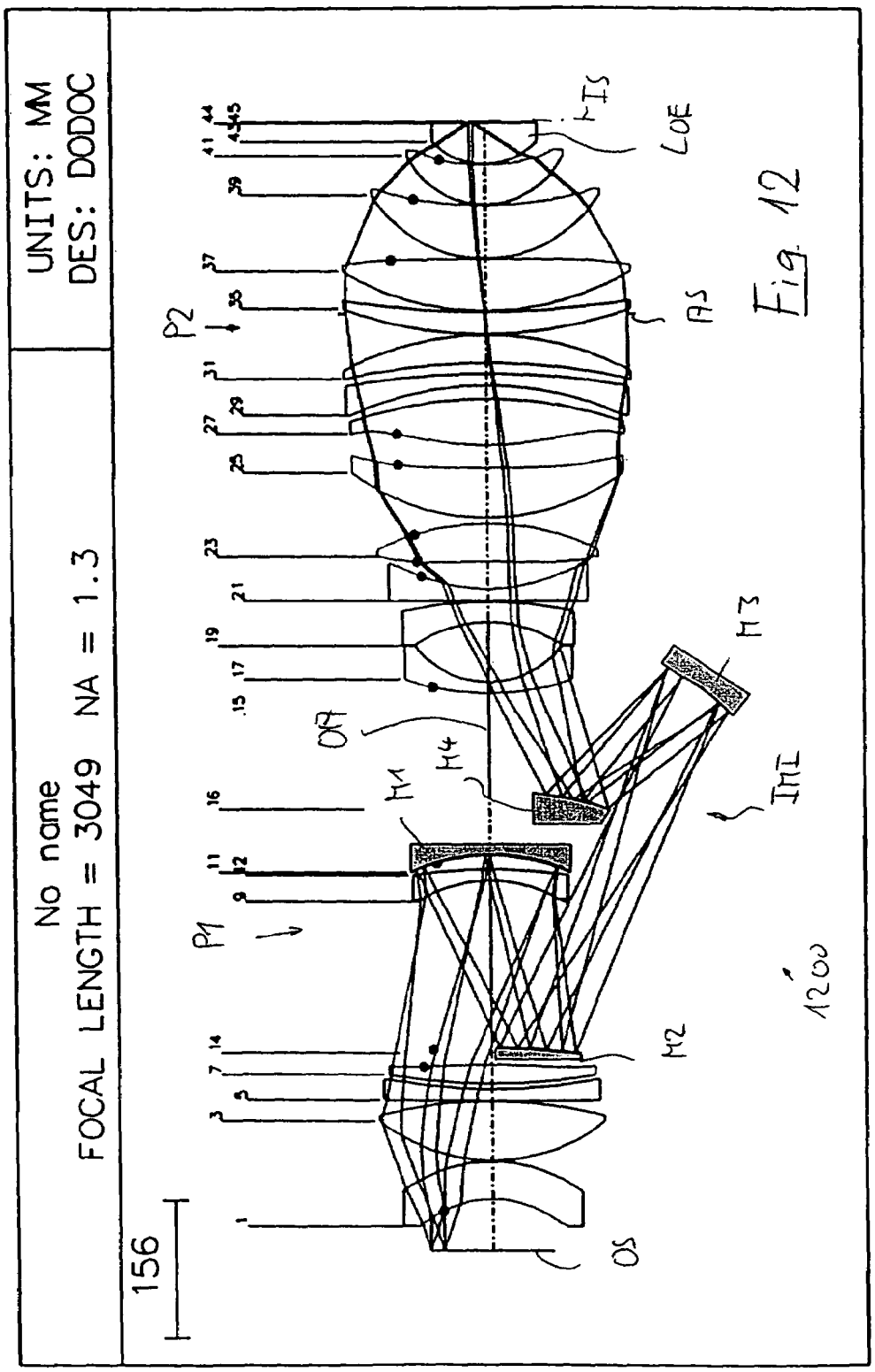

PROJECTION OBJECTIVE

This application claims the benefit of U.S. Provisional Application No. 60/675,875, filed Apr. 29, 2005.

BACKGROUND OF THE INVENTION

1. Field of the Invention

The invention relates to a projection objective for imaging a pattern arranged in an object surface of the projection objective onto an image surface of the projection objective using ultraviolet radiation.

2. Description of the Related Art

Projection objectives are, for example, employed in projection exposure systems, in particular wafer scanners or wafer steppers, used for fabricating semiconductor devices and other types of microdevices and serve to project patterns on photomasks or reticles, hereinafter referred to generically as "masks" or "reticles," onto a substrate having a photosensitive coating with ultrahigh resolution on a reduced scale.

In order to create even finer structures, it is sought to both increase the image-side numerical aperture NA of the projection objective and employ shorter operating wavelengths, preferably ultraviolet radiation with wavelengths $\lambda < 260$ nm.

There are very few materials, in particular, synthetic quartz glass (fused silica) and crystalline fluorides such as calcium fluoride, that are sufficiently transparent in that wavelength region available for fabricating the optical elements. The high prices of the materials involved and limited availability of crystalline calcium fluoride in sizes large enough for fabricating large lenses represent problems. Measures that allow reducing the number and sizes of lenses employed and simultaneously contribute to maintaining, or even improving, imaging fidelity are thus desired.

In the case of reducing optical imaging, in particular of projection lithography, the image-side numerical aperture NA is limited by the refractive index of the surrounding medium in image space. This is why in conventional projection systems having a gas in an image space between an exit surface of the projection objective and the substrate the image-side numerical aperture is limited to values NA<1. In immersion lithography the theoretically possible numerical aperture NA is limited by the refractive index of the immersion medium adjacent to the substrate surface. The immersion medium can be a liquid or a solid. Solid immersion is also spoken of in the latter case.

However, for practical reasons NA should not come arbitrarily close to the refractive index of the last medium (i.e. the medium closest to the image surface), since the propagation angles then become very large relative to the optical axis. It has proven to be practical for the image-side numerical aperture not substantially to exceed approximately 95% of the refractive index of the last medium of the image side. For 193 nm, this corresponds to a numerical aperture of NA=1.35 in the case of water ($n_{H2O}=1.43$) as immersion medium.

With liquids whose refractive index is higher than that of the material of the last lens, or in the case of solid immersion, the material of the last lens element (i.e. the last optical element of the projection objective adjacent to the image) acts as a limitation if the design of the last end surface (exit surface of the projection objective) is to be planar or only weakly curved. The planar design is advantageous, for example, for measuring the distance between wafer and objective, for hydrodynamic behavior of the immersion medium between the wafer to be exposed and the last objective surface, and for their cleaning. The last end surface must be of planar design for solid immersion, in particular, in order to expose the wafer, which is likewise planar.

For deep ultraviolet radiation (DUV, operating wavelength of 248 nm or 193 nm) the materials normally used for the last lens are fused silica (synthetic quartz glass, $SiO_2$) with a refractive index of $n_{SiO2}=1.56$ or $CaF_2$ with a refractive index of $n_{CaF2}=1.50$. The synthetic quartz glass material may also be referred to simply as "quartz" in the following. Because of the high radiation load in the last lens elements, at 193 nm calcium fluoride is preferred for the last lens since synthetic quartz glass would be damaged in the long term by the radiation load. This results in a numerical aperture of approximately 1.425 (95% of n=1.5) which can be achieved. If the disadvantage of the radiation damage is accepted, quartz glass still allows numerical apertures of 1.48 (corresponding to approximately 95% of the refractive index of quartz at 193 nm). The relationships are similar at 248 nm.

International patent application PCT/EP2004/014062 filed by the applicant on Dec. 10, 2004 discloses catadioptric projection objectives suitable for immersion lithography at NA>1 comprising a first, refractive objective part for imaging a pattern provided in the object surface into a first intermediate image, a second, catoptric (purely reflective) objective part for imaging the first intermediate image into a second intermediate image, and a third, refractive objective part for imaging the second intermediate image directly onto the image surface. The second objective part includes two concave mirrors having mirror surfaces facing each other, where each concave mirror is positioned optically remote from a pupil surface. The design is rotational symmetric and has one straight optical axis common to all refractive and reflective optical elements (in-line system). Projection objectives of this basic design are disclosed e.g. in U.S. provisional application 60/536,248 filed on Jan. 14, 2004 by the applicant. PCT/EP2004/014062 discloses embodiments having at least one optical element made from high-index material with a refractive index $n \geq 1.6$ at the operating wavelength. At 193 nm, sapphire ($Al_2O_3$) is used as high-index material for a plano-convex lens forming the last lens of the projection objective. In some embodiments, Cyclohexane is used as an immersion fluid, which has a refractive index n=1.556 similar to that of fused silica (n=1.560) at 193 nm. An embodiment designed for solid immersion (contact projection lithography) has a piano-convex sapphire lens ($n_{sapphire}=1.92$) which enables NA=1.6 in the disclosed embodiment.

U.S. provisional application 60/544,967 filed by the applicant on Feb. 13, 2004 shows catadioptric projection objectives having similar basic design (as disclosed e.g. in U.S. provisional application 60/536,248 mentioned above) adapted for use with immersion liquids having a refractive index which is larger than the refractive index of the last lens on the image side. The projection objective is designed in such way that the immersion fluid is curved convexly towards the projection objective during operation. The convex curvature of the immersion fluid allows to use larger incidence angles for projection radiation on the interface between the last lens and the immersion fluid, whereby reflection losses at this interface are decreased and higher values for NA are possible, which may be larger than the refractive index of the last lens.

The disclosures of the applications mentioned above are incorporated into the present application by reference.

Various catadioptric in-line projection objectives have been proposed, From an optical point of view, in-line systems may be favorable since optical problems caused by utilizing planar folding mirrors, such as polarization effects, can be avoided. Also, from a manufacturing point of view, in-line systems may be designed such that conventional mounting techniques for optical elements can be utilized, thereby improving mechanical stability of the projection objectives.

The Patent EP 1 069 448 B1 discloses catadioptric projection objectives having two concave mirrors facing each other and an off-axis object and image field. The concave mirrors are part of a first catadioptric objective part imaging the object onto an intermediate image positioned adjacent to a concave mirror. This is the only intermediate image, which is imaged to the image plane by a second, purely refractive objective part. The object as well as the image of the catadioptric imaging system are positioned outside the intermirror space defined by the mirrors facing each other. Similar systems having two concave mirrors, a common straight optical axis and one intermediate image formed by a catadioptric imaging system and positioned besides one of the concave mirrors is disclosed in U.S. patent application US 2002/0024741 A1.

U.S. patent application US 2004/0130806 (corresponding to European patent application EP 1 336 887) discloses catadioptric projection objectives having off-axis object and image field, one common straight optical axis and, in that sequence, a first catadioptric objective part for creating a first intermediate image, a second catadioptric objective part for creating a second intermediate image from the first intermediate image, and a refractive third objective part forming the image from the second intermediate image. Each catadioptric system has two concave mirrors facing each other. The intermediate images lie outside the intermirror spaces defined by the concave mirrors.

Japanese patent application JP 2003114387 A and international patent application WO 01/55767 A disclose catadioptric projection objectives with off-axis object and image field having one common straight optical axis, a first catadioptric objective part for forming an intermediate image and a second catadioptric objective part for imaging the intermediate image onto the image plane of this system. Concave and convex mirrors are used in combination.

U.S. patent application US 2003/0234992 A1 discloses catadioptric projection objectives with off-axis object and image field having one common straight optical axis, a first catadioptric objective part for forming an intermediate image, and a second catadioptric objective part for imaging the intermediate image onto the image plane. In each catadioptric objective part concave and convex mirrors are used in combination with one single lens.

International patent application WO 2004/107011 A1 discloses various catadioptric projection objectives with off-axis object field and image field having one common straight optical axis designed for immersion lithography using pure water ($H_2O$) as immersion liquid and an arc shaped effective object field having a field center far away from the optical axis. The projection objectives include various types of mirror groups having two, four or six curved mirrors. Embodiments with two to four intermediate images are disclosed. Silicon dioxide ($SiO_2$) and/or Calcium fluoride ($CaF_2$) are used as lens material. Image-side numerical apertures up to NA=1.2 are obtained.

From a practical point of view, the maximum image-side numerical aperture which can be achieved is only one of a number of design goals for which an optimum compromise must be found depending on limiting conditions imposed for a specific application. In view of the limited availability of optical materials, such as Calcium fluoride, the maximum size (diameter) of lenses needed for a design may be a limiting factor. Typically, the maximum lens diameter necessary in a design is increased as the image-side numerical aperture increases. Specifically, very large diameters are needed in an aperture-defining lens group arranged on the image side between and image-side pupil surface of the projection objective and the image surface. The aperture-defining lens group is basically designed for converging radiation coming from the image-side pupil surface towards the image surface to define the image-side numerical aperture. With other words, the aperture-defining lens group performs the pupil imaging. Also, the focal length of the aperture-defining lens group responsible for the pupil imaging tends to decrease as the image-side numerical aperture is increased. Shortening the focal length of the aperture-defining lens group, however, makes it more difficult to provide sufficient correcting means for the pupil imaging since the number of optical surfaces within the aperture-defining lens group is limited.

SUMMARY OF THE INVENTION

It is one object of the present invention to provide a compact projection objective that can be built with relatively small amounts of transparent optical material and allows sufficient degrees of freedom for correcting the imaging, particularly for the pupil imaging between the most image-side pupil surface and the image surface. It is another object of the invention to provide a catadioptric in-line projection objective for microlithography suitable for use in the deep ultraviolet range having potential for very high image-side numerical aperture which may extend to values allowing immersion lithography at numerical apertures NA>1.

According to one formulation, the invention provides a projection objective for imaging a pattern arranged in an object surface of the projection objective onto an image surface of the projection objective using ultraviolet radiation comprising:

a plurality of optical elements including transparent optical elements transparent for radiation at an operating wavelength $\lambda$, where 260 nm>$\lambda$>150 nm;

an image-side pupil surface being the pupil surface closest to the image surface;

an aperture-defining lens group arranged between the image-side pupil surface and the image surface for converging radiation coming from the image-side pupil surface towards the image surface to define an image-side numerical aperture NA, where 0.7≦NA≦1.4.

wherein the aperture-defining lens group includes at least one high-index lens made from a transparent high-index material having a refractive index $n_{HI}$, where $n_{HI}$>$n_{SIO2}$, and where $n_{SIO2}$ is the refractive index of silicon dioxide ($SiO_2$) at the operating wavelength.

If at least one lens having a refractive index larger than that of fused silica at the operating wavelength is used in the aperture-defining lens group responsible for the pupil imaging, additional degrees of freedom with respect to correction of imaging aberrations become available. Firstly, additional space for lenses may be provided between the image-side pupil surface and the image surface such that more lens surfaces contributing to imaging correction can be utilized in that region. Further, since the refractive power of a lens depends on the radii of the lens surfaces and the refractive index of the lens material, utilizing high-index material for a lens allows to decrease the lens radii and still obtain a desired refractive power. A decrease in lens radius, however, tends to decrease the contribution of a lens surface to aberrations, whereby image aberrations can be avoided to some extent in the first place if a high-index material is used in the aperture-defining lens group. Further, a relaxed construction of the aperture-defining lens group allows additional degrees of freedom for positioning an aperture stop at or close to the image-side pupil surface and to allow space for adjusting the diameter of the aperture stop as needed. These advantageous can be obtained in conjunction with moderate lens sizes particularly in the region close to the image-side pupil surface, whereby a projection objective can be provided at reasonable costs.

In some embodiments, the high-index material has a refractive index $n_{HI}>1.6$ at the operating wavelength. The high-index material may be a solid material chosen from the group including aluminum oxide ($Al_2O_3$), magnesium aluminum oxide ($MgAl_2O_4$, spinell), lanthanum fluoride ($LaF_3$), mixtures of calcium strontium oxide or magnesium strontium oxide. The latter mixed materials have been proposed e.g. in the article "Immersion efforts looks to new crystals, liquids" by D. Lammers, EE Times, Aug. 16, 2004 e.g. in: http://www.siliconstrategies.com. These materials may be used to provide one or more solid high-index lenses.

Alternatively, or in addition, at least one high-index liquid material may be used having a refractive index $n_{HI}>1.4$. The liquid material may be chosen from the group including Cyclohexane and doped water. In the article "'Doped water' could extend 193 nm immersion litho" by D. Lammers, EE Times Jan. 28, 2004 available e.g. through http://www.eetimes.com it has been proposed that immersion liquids with refractive index higher than water (n=1.437) can be obtained by mixing water with sulphates, alkilies such as caesium, or various phosphates. Caesium sulphate is reported to mix readily with water to obtain a liquid with refractive index 1.6 (see e.g. article "IMST Immersion workshop looks foreward to manufacturing", Jan. 29, 2004, e.g. in: http://www.euro-semi.eu.com.

Using a high-index liquid allows to provide one or more high-index lenses formed as a liquid lens having positive or negative refractive power from a liquid transparent to radiation at the operating wavelength and confined between an object-side bordering element and an image-side bordering element. In some embodiments, the object-side bordering element is a last solid optical element of the projection objective and the image-side bordering element is the substrate to be exposed. In this case an immersion liquid in contact with the substrate may form the liquid lens.

It is also possible that the object-side bordering element and the image-side bordering element are formed by transparent elements of the projection objectives such that at least one liquid lens is formed at a position spaced apart from the image surface of the projection objective, e.g. within in the projection objective.

In some embodiments it has been found useful that at least one of the bordering elements adjacent to a liquid lens has a refractive index which is close to the refractive index of the high-index liquid forming the liquid lens, where preferably the condition $\Delta n \leq 0.04$ applies for the refractive index difference $\Delta n$ between the refractive indexes of the bordering element and the liquid lens. Particularly small aberration contributions can be obtained at the interface between the object-side bordering element and the high-index liquid if this condition is observed.

The aperture-defining lens group includes positions optically close to the last pupil surface, positions optically close to the image surface and intermediate positions positioned there between. In positions close to the pupil surface, the chief ray height (CRH) has small values close to or at zero, whereas the marginal ray height (MRH) attains values close to or at a local maximum. In contrast, in a region optically close to the image surface the marginal ray height decreases drastically, whereas the chief ray height increases between the image-side pupil surface and the image surface. Preferably, at least one high-index lens is arranged optically close to the image surface, particularly where the marginal ray height (MRH) is less than 50% of the marginal ray height at the image-side pupil surface. Preferably, at least the material in contact with the substrate or positioned closest to the substrate to be exposed may be the high-index material (liquid or solid).

According to another formulation, the invention provides a catadioptric projection objective for imaging a pattern arranged in an object surface of the projection objective onto an image surface of the projection objective using ultraviolet radiation comprising:

a first objective part for imaging the pattern on the object surface onto a first intermediate image; and a second objective part for imaging an intermediate image onto the image surface and having an image-side pupil surface being the pupil surface closest to the image surface, at least one of the objective parts including at least one concave mirror and all optical elements (refractive and reflective) sharing a common straight optical axis (in-line system);

wherein the second objective part includes an aperture-defining lens group arranged between the image-side pupil surface and the image surface for converging radiation coming from the image-side pupil surface towards the image surface to define an image-side numerical aperture NA, where $1.2 \leq NA \leq 1.4$ in conjunction with an immersion medium, the aperture-defining lens group including three aspheric lens surfaces.

Preferably, the aperture-defining lens group includes exactly three aspheric lens surfaces.

Alternatively, or in addition, it may be preferable that the aperture-defining lens group includes exactly three lenses having an aspherical lens surface.

It has been found that providing three aspherical lens surfaces provides an optimum compromise between benefits obtained by using aspherical surfaces for correction of the pupil imaging and the drawbacks resulting from the difficulties to manufacture an aspherical lens surface as compared to manufacturing a spherical lens surface. In this context, an aspherical lens surface is preferably a lens surface where the deformation (deviation of the aspherical lens surface from a spherical surface defining the best fitting sphere) is larger than 0.01 mm. Substantial correcting effect can then be obtained with each of the aspherical lens surfaces.

According to another aspect the projection objective includes a number $N_{ASP}$ of aspheric lens surfaces and a number $N_{ASPL}$ of lenses having at least one aspheric lens surface, wherein the condition AR>1 holds for the asphere ratio $AR=N_{ASP}/N_{ASPL}$.

If this condition is fulfilled regions with a spatially dens sequence of aspheric lens surfaces can be obtained. In some embodiments, at least one "double asphere" is obtained within the projection objective. The term "double asphere" as used here describes a situation where two aspherical optical surfaces are directly following each other along the optical path. The double asphere may be formed by facing aspherical surfaces of two separate, neighboring optical elements in a lens/lens or lens/mirror configuration. The double asphere may also be formed by a double aspherical lens (biasphere) where both lens surfaces are aspherical surfaces. It has been found that the large density of aspherical surfaces, particularly including one or more double aspheres, may be more effective for aberration correction than a more even distribution of aspherical surfaces. In some embodiments, an aspherical surface may be positioned next to a double asphere to form a triple asphere having three immedeately consecutive aspherical surfaces, whereby a very dense spatial configuration of aspherical surfaces can be obtained.

In some embodiments the projection objective includes at least one concave mirror positioned optically close to a pupil surface or at a pupil surface, where negative refractive power is arranged close to that concave mirror such that radiation impinging on the concave mirror and reflected from the concave mirror is influenced by negative refractive power. A significant contribution to correction of chromatic aberrations, particularly chromatic length aberration (CHL), may be obtained.

The previous and other properties can be seen not only in the claims but also in the description and the drawings, wherein individual characteristics may be used either alone or in sub-combinations as an embodiment of the invention and in other areas and may individually represent advantageous and patentable embodiments.

BRIEF DESCRIPTION OF THE DRAWINGS

FIG. 12 shows a meridional lens section of a variant of the fifth embodiment of a catadioptric in-line projection objective.

DETAILED DESCRIPTION OF THE PREFERRED EMBODIMENTS

Figure 1:
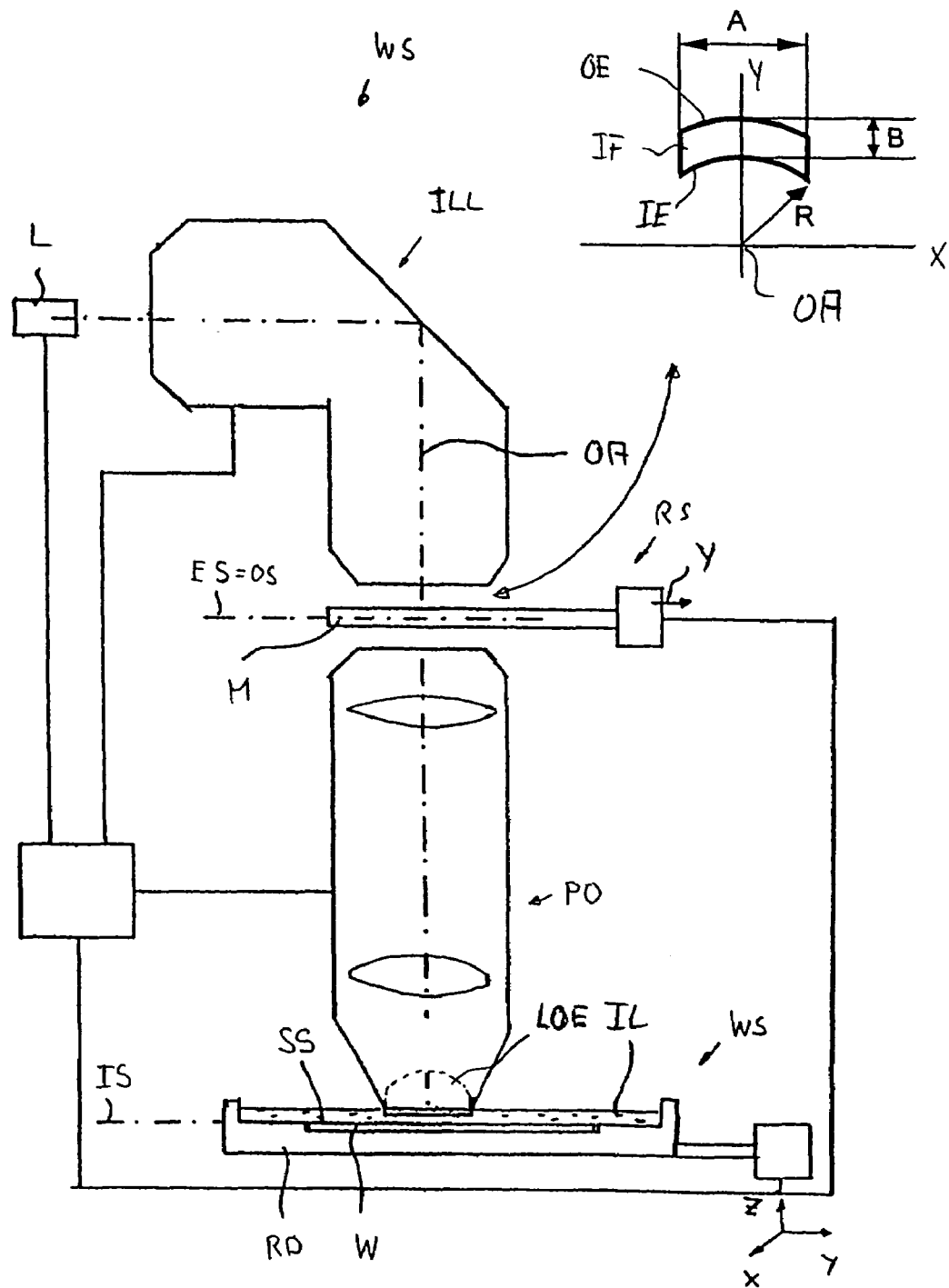
FIG. 1 shows a schematic drawing of a projection exposure system for microlithography having an illumination system designed for creating an arc shaped illumination field and a catadioptric projection objective.

In the following description of preferred embodiments of the invention, the term "optical axis" shall refer to a straight line or sequence of straight-line segments passing through the centers of curvature of the optical elements. In the case of those examples presented here, the object is either a mask (reticle) bearing the pattern of an integrated circuit or some other pattern, for example, a grating pattern. In the examples presented here, the image of the object is projected onto a wafer serving as a substrate that is coated with a layer of photoresist, although other types of substrate, such as components of liquid-crystal displays or substrates for optical gratings, are also feasible.

Embodiments having a plurality of mirrors are described. Unless stated otherwise, the mirrors will be numbered according to the sequence in which the radiation is reflected on the mirrors. With other words, the numbering of the mirrors denotes the mirrors according to the position along the optical path of radiation, rather than according to geometrical position.

The terms "front" and "rear" as well as the terms "upstream" and "downstream" relate to relative positions along the optical path, where "front" and "upstream" relate to positions closer to the object surface.

Where appropriate, identical or similar features or feature groups in different embodiments are denoted by similar reference identifications. Where reference numerals are used, those are increased by 100 or multiples of 100 between embodiments.

Where tables are provided to disclose the specification of a design shown in a figure, the table or tables are designated by the same numbers as the respective figures.

FIG. 1 shows schematically a microlithographic projection exposure system in the form of a wafer scanner WS, which is provided for fabricating large scale integrated semiconductor components by means of immersion lithography in a step-and-scan mode. The projection exposure system comprises as light source an Excimer laser L having an operating wavelength of 193 nm, other operating wavelengths, for example 157 nm or 248 nm, also being possible. A downstream illumination system ILL generates, in its exit surface ES, a large, sharply delimited, homogeneously illuminated illumination field IF that is adapted to the telecentric requirements of the downstream catadioptric projection objective PO. The illumination system ILL has devices for selection of the illumination mode and, in the example, can be changed over between conventional on-axis illumination with a variable degree of coherence, and off-axis illumination, particularly annular illumination (having a ring shaped illuminated area in a pupil surface of the illumination system) and dipole or quadrupole illumination.

Arranged downstream of the illumination system is a device RS (reticle stage) for holding and manipulating a mask M in such a way that the mask lies in the exit surface ES of the illumination system coinciding with the object surface OS of the projection objective PO and can be moved in this plane for scanning operation in a scanning direction (Y-direction) perpendicular to the optical axis OA common to the illumination system and the projection objective (i.e. the Z-direction).

The reduction projection objective PO is designed to image an image of a pattern provided by the mask with a reduced scale of 4:1 onto a wafer W coated with a photoresist layer. Other reduction scales, e.g. 5:1 or 8:1 are possible. The wafer W serving as a light-sensitive substrate is arranged in such a way that the planar substrate surface SS with the photoresist layer essentially coincides with the planar image surface IS of the projection objective. The wafer is held by a device WS (wafer stage) comprising a scanner drive in order to move the wafer synchronously with the mask M in parallel with the latter. The device WS also comprises manipulators in order to move the wafer both in the Z direction parallel to the optical axis OA and in the X and Y directions perpendicular to said axis. A tilting device having at least one tilting axis running perpendicular to the optical axis is integrated.

The device WS provided for holding the wafer W (wafer stage) is constructed for use in immersion lithography. It comprises a receptacle device RD, which can be moved by a scanner drive and the bottom of which has a flat recess for receiving the wafer W. A peripheral edge forms a flat, upwardly open, liquidtight receptacle for a liquid immersion medium IM, which can be introduced into the receptacle and discharged from the latter by means of devices that are not shown. The height of the edge is dimensioned in such a way that the immersion medium that has been filled in can completely cover the surface SS of the wafer W and the exit-side end region of the projection objective PO can dip into the immersion liquid given a correctly set operating distance between objective exit and wafer surface.

The projection objective PO has a planoconvex lens as the last optical element LOE nearest to the image surface IS, the planar exit surface of said lens being the last optical surface (exit surface) of the projection objective PO. During operation of the exposure system, the exit surface of the last optical element is completely immersed in the immersion liquid IL and is wetted by the latter. In the exemplary case, ultrapure water having a refractive index $n_I \approx 1.437$ (193 nm) is used as the immersion liquid.

As shown schematically in the inset figure of FIG. 1, the illumination system ILL is capable of generating an illumination field IF having a arcuate shape (annular field or ring field). The size and shape of the arcuate illumination field determines the size and shape of the effective object field OF of the projection objective actually used for projecting an image of a pattern on a mask in the image surface of the projection objective. The illumination field IF has a length B parallel to the scanning direction and a width A perpendicular to the scanning direction. A curved inner edge IE closer to the optical axis and an outer edge OE further away from the optical axis and radially off-set in Y-direction by length B have the same edge radius R. It is a characterizing feature that the illumination field does not include the optical axis (off-axis illumination field).

Figure 2:
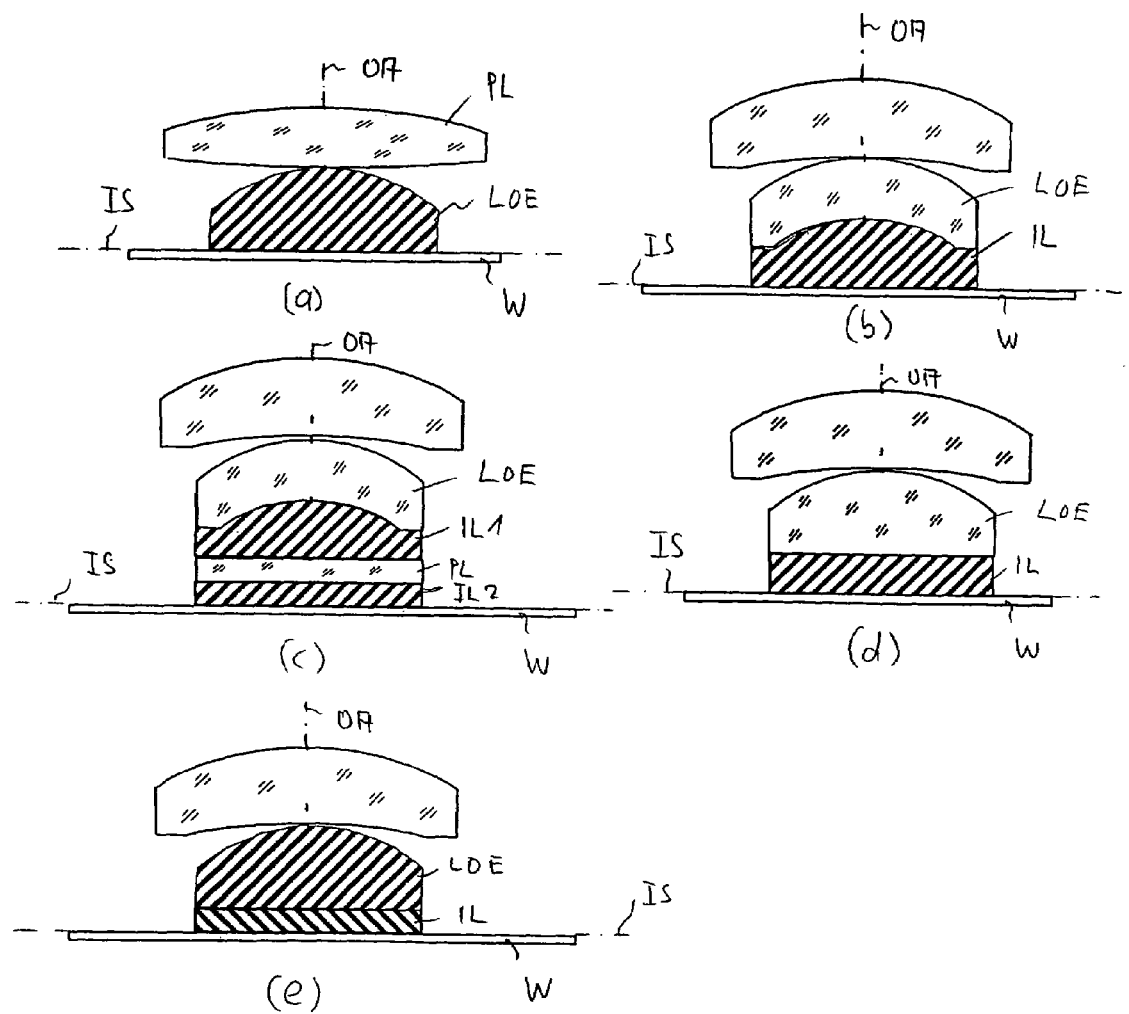
FIG. 2 shows schematic drawings representing various configurations for using high-index material at the image-side end of a projection objective.

FIG. 2 shows schematically various configurations of transparent optical materials close to the image-side end of the projection objective and in the image space defined between a last optical element of the projection objective and the image surface IS, where the surface of the substrate W is positioned. In each example, high-index material having a refractive index larger than that of fused silica at the operating wavelength (e.g. 193 nm) is identified by hatching.

In FIG. 2(a) the image-side end of a projection objective designed for solid immersion is shown. The projection objective has a last optical element LOE closest to the image surface IS formed as a plano-convex lens made of a high-index solid material, such a sapphire ($Al_2O_3$), which has a spherically or aspherically curved entry surface and a planar exit surface essentially coinciding with the image surface of the projection objective. In embodiments designed for near-field lithography, a small image-side working distance in the order of the operating wavelength or fractions thereof may be provided. The last but one optical element is a positive lens typically made of fused silica or calcium fluoride.

In the configuration of FIG. 2(b) the last optical element LOE of the projection objective is formed by a meniscus lens having a convexly curved entry surface and a concave exit surface facing the image surface IS positioned at a distance from the exit surface. A high index immersion liquid IL fills the image space between the exit surface of the projection objective (formed by the exit surface of the last optical element) and the substrate W at the image surface such that a liquid lens having positive refractive power is formed. Providing an immersion liquid which, during operation of the projection objective, is curved convexly towards the projection objective allows to use immersion liquids having a refractive index larger than the refractive index of the last optical element without limiting the image-side numerical aperture NA to values slightly smaller or at the refractive index of the material of the last optical element. Particularly, higher incidence angles of projection radiation impinging on the interface between the last optical element and the immersion liquid can be used without causing intolerable reflection losses at this interface. This, in turn allows higher values for NA which may be larger than the refractive index of the last optical element LOE.

In FIG. 2(c) a double-immersion-configuration is shown as a variant of the configuration of FIG. 2(b). As in that case, the last optical element LOE of the projection objective, which cannot be exchanged, is a meniscus lens having a concave exit side facing the image surface IS. A plane parallel plate PL is provided at a distance from the last optical element parallel to the image surface of the projection objective such that a first, essentially plano-convex interspace is formed between the last optical element LOE and the parallel plate PL, and a second, plane parallel interspace is formed between the plate PL and the image surface. The exchangeable plate PL may be fixed to the body of the projection objective. It is also possible that the plate is fixed to a separate holder. A first immersion liquid IL1 is filling the first interspace between the last optical element LOE and the plate PL, and a second high index immersion liquid IL2 fills the narrow, uniformly-sized interspace between the plate PL and the substrate W.

The advantages concerning attainable numerical apertures are essentially the same as explained in connection with FIG. 2(b). However, a double-immersion configuration allows to obtain a laminar flow of the immersion liquid IL2 in contact with the photosensitive substrate which allows a continuous or intermittent exchange and a better temperature control of that fluid, whereby the influence of the immersion on the optical performance is improved. Also, in case of contamination of one or both faces of the plate PL, the plate may be exchanged for a clean plate. Further, if, for example, the last optical element LOE is made of calcium fluoride, a contact of that material with water-based immersion liquid should be avoided as calcium fluoride is soluble in water. Therefore, using a parallel plate PL allows to use a water-based immersion liquid as a second immersion liquid IL2 in contact with a substrate, where the first immersion liquid IL1 can be chosen such that it is not aggressive against calcium fluoride. The parallel plate PL may be made of fused silica, which is chemically stable against water and other, water-based immersion liquids. Each of the immersion liquids IL1, IL2 has a refractive index larger than that of silicon dioxide. The immersion liquids IL1 and IL2 may be the same or different.

In FIG. 2(d) a basic configuration similar to "conventional" immersion lithography is shown. A plano-convex last optical element LOE of the projection objective, e.g. made of fused silica or calcium fluoride, is in contact with a high-index immersion liquid IL filling the image space between the planar exit side of the last optical element and the image surface.

The configuration in FIG. 2(e) is a variant of a "conventional" immersion system having a plano-convex lens as last optical element LOE of the projection objective. In FIG. 2(e) this lens is made of a solid high-index material, such as aluminum oxide. During operation, an image space between the planar exit surface of the last optical element and the image surface of the projection objective is filled with a high-index immersion liquid IL having a refractive index which may be essentially the same as that of the last optical element LOE or larger.

Note that in all configurations the numerical aperture in all transparent optical materials between the last curved surface with refractive power of the optical elements and the image surface remains constant between that surface and the image surface, whereas the propagation angles (angles measured between the propagation direction of a ray and the optical axis) vary depending on the various refractive indices of the transparent optical materials.

In each of the following embodiments in FIGS. 3 to 10 one of the configurations mentioned above is used on the image-end side of a catadioptric in-line projection objective designed for 193 nm operation wavelength and adapted to an arc-shaped image field. The image field is characterized by A=26 mm, B=5.5 mm and R=11.5 mm (compare inset in FIG. 1) in the embodiments of FIGS. 3 to 6 and 11 (two-mirror systems) and by A=26 mm, B=4 mm and R=14 mm in the embodiments of FIGS. 7 to 10 and 12 (four-mirror systems). Note that the size of the effective image field relates to the size of the effective object field provided by the illumination system by the magnification factor β=0.25 of the projection objective.

Preferred embodiments of catadioptric projection objectives adapted to be used in a microlithographic projection exposure system will now be described in detail. In all embodiments given below the surfaces of curvature of all curved mirrors have a common axis of rotational symmetry which coincides with the optical axis OA of the projection objective. Catadioptric projection objectives having an even number of mirrors, particularly axially symmetric systems, also named inline systems, are provided this way. No planar folding mirrors are used or needed in these designs. The effective object field and image field are off-axis, i.e. positioned at a radial distance from the optical axis. All systems have a circular pupil centered around the optical axis thus allowing use as projection objectives for microlithography.

Figure 3:
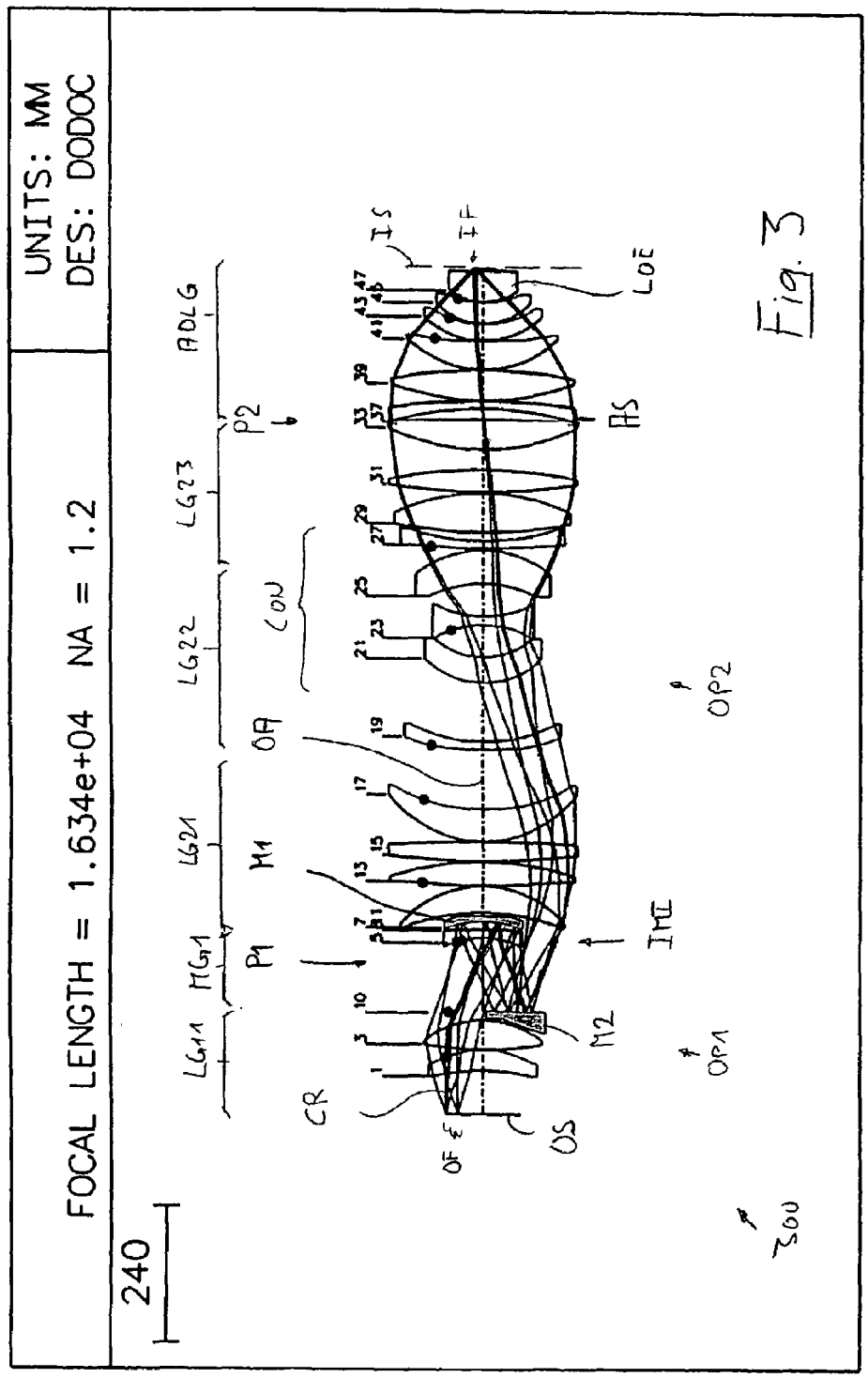
FIG. 3 shows a meridional lens section of a first embodiment of a catadioptric in-line projection objective.

FIG. 3 shows a meridional lens section (in a Y-Z-plane) of an embodiment of a catadioptric projection objective 300 designed to project an image of a pattern on a reticle arranged in the planar object surface OS (object plane) onto a planar image surface IS (image plane) on a reduced scale, for example 4:1, while creating exactly one real intermediate image IMI. An off-axis effective object field OF positioned outside the optical axis OA is thereby projected on an off-axis image field IF. The effective object field OF is an arcuate "ring field" shaped generally in accordance with the inset of FIG. 1. The trajectory of a chief ray CR of an outer field point of the off-axis object field OF in the meridional plane (drawing plane) is drawn bold in order to facilitate following the beam path. Aspherical surfaces are indicated by a dot.

For the purpose of this application, the term "chief ray" (also known as principal ray) denotes a ray emanating from an outermost field point (farthest away from the optical axis) of the effectively used object field OF and intersecting the optical axis at least one pupil surface position. Due to the rotational symmetry of the system the chief ray may be chosen from an equivalent field point in the meridional plane, as shown in the figures for demonstration purposes. In projection objectives being essentially telecentric on the object side, the chief ray emanates from the object surface parallel or at a very small angle with respect to the optical axis. The imaging process is further characterized by the trajectory of marginal rays. A "marginal ray" as used herein is a ray running from an axial object field point (on the optical axis) to the edge of an aperture stop AS. That marginal ray may not contribute to image formation due to vignetting when an off-axis effective object field is used. The chief ray and marginal ray are chosen to characterize optical properties of the projection objectives.

The projection objective 300 is designed as an immersion objective for λ=193 nm having an image side numerical aperture NA=1.2 when used in conjunction with pure water as an immersion liquid between the exit face of the high-index last optical element and the image surface. Specifications are summarized in Table 3. The leftmost column lists the number of the refractive, reflective, or otherwise designated surface, the second column lists the radius, r, of that surface [mm], the third column indicates the aspheric surfaces, the fourth column lists the distance, d [mm], between a surface and the next surface, a parameter that is referred to as the "thickness" of the optical surface, the fifth column lists the material employed for fabricating that optical element, and the sixth column lists the refractive index of that material. The seventh column lists the optically utilizable, clear, semi diameter [mm] of the optical component. A radius r=0 in a table designates a planar surface (having infinite radius).

A number of surfaces in table 3 are aspherical surfaces. Table 3A lists the associated data for those aspherical surfaces, from which the sagitta or rising height p(h) of their surface figures as a function of the height h may be computed employing the following equation:

$$p(h)=[((1/r)h^2)/(1+SQRT(1-(1+K)(1/r)^2h^2))]+C1\cdot h^4+C2\cdot h^6+\ldots,$$

where the reciprocal value (1/r) of the radius is the curvature of the surface in question at the surface vertex and h is the distance of a point thereon from the optical axis. The sagitta or rising height p(h) thus represents the distance of that point from the vertex of the surface in question, measured along the z-direction, i.e., along the optical axis. The constants K, C1, C2, etc., are listed in Table 3A.

A first, catadioptric objective part OP1 is designed to image the object field into the only intermediate image IMI at an enlarging magnification ratio $\beta_1=-1.63$. A second, purely refractive objective part OP2 is designed to image the intermediate image INI at a reducing magnification $\beta_2=-0.15$ into the image field IF positioned in the image surface IS. A first pupil surface P1 is formed within the first objective part at a position where the chief ray CR intersects the optical axis OA between object field and intermediate image IMI. A second pupil surface P2 is formed in the second objective part where the chief ray CR intersects the optical axis a second time. The second pupil surface P2 is the image-side pupil surface closest to the image surface. The aperture stop AS, which may be variable to define the effectively used numerical aperture, is placed in the vicinity of the image-side pupil surface. An aperture-defining lens group ADLG arranged between the image-side pupil surface P2 and the image surface IS performs a pupil imaging and concentrates positive refractive power for converging radiation coming from the image-side pupil surface towards the image surface to define the image-side numerical aperture NA=1.2.

The first objective part has a first, refractive lens group LG11 having two positive lenses, and a mirror group MG1 including a first, concave mirror M1 situated on the optical axis OA optically close to the first pupil surface P1 and having a mirror surface facing the object-side, and a second mirror M2 having a large-radius convex mirror surface facing the image-side positioned outside the optical axis optically close to the intermediate image. A negative meniscus lens (surfaces 5, 6) situated in front of the first mirror M1 is passed twice by the radiation. In combination with positive optical power provided by the concave mirror M1 a correcting effect on chromatic aberrations is obtained and the angular spectrum of radiation impinging on second mirror M2 is adjusted appropriately.

The second objective part OP2 includes a first lens group LG21 with positive refractive power, a second lens group LG22 with negative refractive power to define a constriction region CON where the beam bundle diameter attains a local minimum, a third lens group LG23 with positive refractive power for defining the shape and angular spectrum of the radiation at the second pupil surface P2, and the aperture-defining lens group ADLG having overall positive refractive power.

The concave mirror M1 has sufficient optical power to compensate, in combination with the doubly passed lens in front of it, the opposite effect of the positive lenses on Petzval sum. The intermediate image IMI is overcorrected for Petzval sum. This effect is compensated by the second objective part, which includes positive refractive power concentrated in the aperture-defining lens group ADLG where the marginal ray height attains a local maximum, thereby providing strong undercorrection of Petzval sum such that an essentially flat image is obtained.

The aperture-defining lens group ADLG includes exactly three aspherical lenses immediately upstream of the plano-convex last optical element LOE and formed by positive meniscus lenses having concave, aspherical exit surfaces facing the image surface. The image-side end of the projection objective is designed generally in accordance with FIG. 2(a). The last optical element LOE is formed by a high-index magnesium aluminum oxide mixture with spinell structure having refractive index $n_{HI}$=1.702. An image-side working distance of about 2 mm between the planar exit side of the last optical element in the image surface is filled with a high-index immersion liquid having $n_{il}$=1.597. Cycloheptane may be used for that purpose.

Although an image-side numerical aperture substantially larger than NA=1.2 could be obtained in that configuration, the high-index material optically close to the image surface is primarily used to relax the construction of the aperture-defining lens group by enlarging the focal length of that lens group in order to provide sufficient installation space for lenses contributing to aberration correction.

Figure 4:
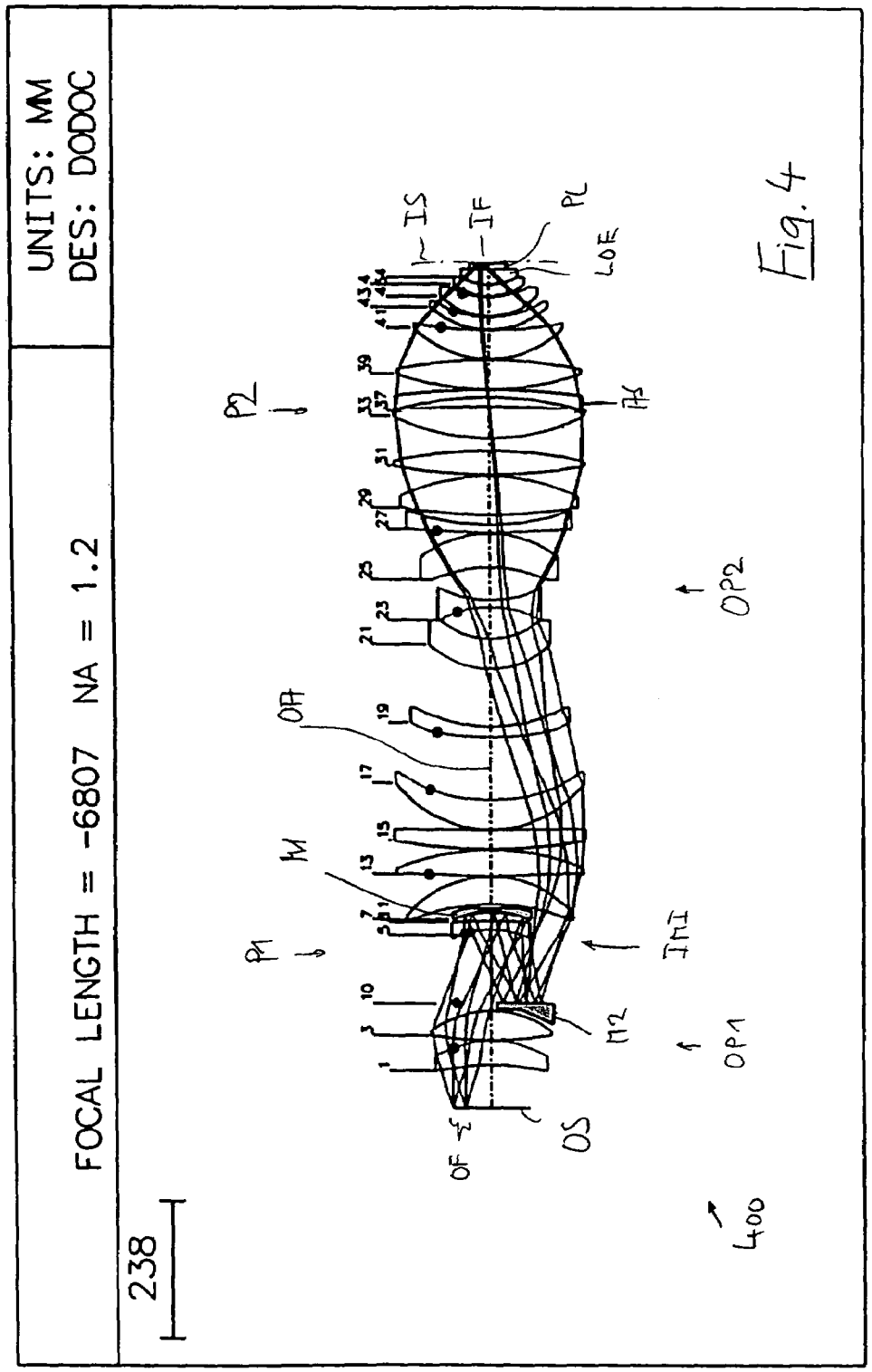
FIG. 4 shows a meridional lens section of a second embodiment of a catadioptric in-line projection objective.

The projection objective 400 of FIG. 4 is a variant of the projection objective 300 designed for double-immersion generally in accordance with FIG. 2(c). This sequence and types of lenses upstream of the aspherical exit surface of the most image-side positive meniscus lens (surface 46) is essentially the same as in objective 300 (compare tables 3 and 4), therefore reference is made to that description. In contradistinction to embodiment 300, the image-side end includes a last but one lens designed as a positive meniscus lens having a concave exit surface facing the image surface, and a last optical element LOE designed as a positive meniscus lens having a concave exit surface facing the image surface. A plane parallel plate PL is arranged at a distance from the last optical element between that optical element and the image surface. During operation, a plano-convex interspace between the last optical element LOE and the parallel plate PL, as well as an plane parallel interspace between the parallel plate PL and the image surface are filled with the same high-index immersion liquid having refractive index near to $n_{HI}$=1.702 substantially larger than the refractive index $n_{SIO2}$=1.561 of the last optical element LOE and the parallel plate PL. A cyclic hydrocarbon, such as Decalin (Decahydronaphthalene) may be used.

Figure 5:
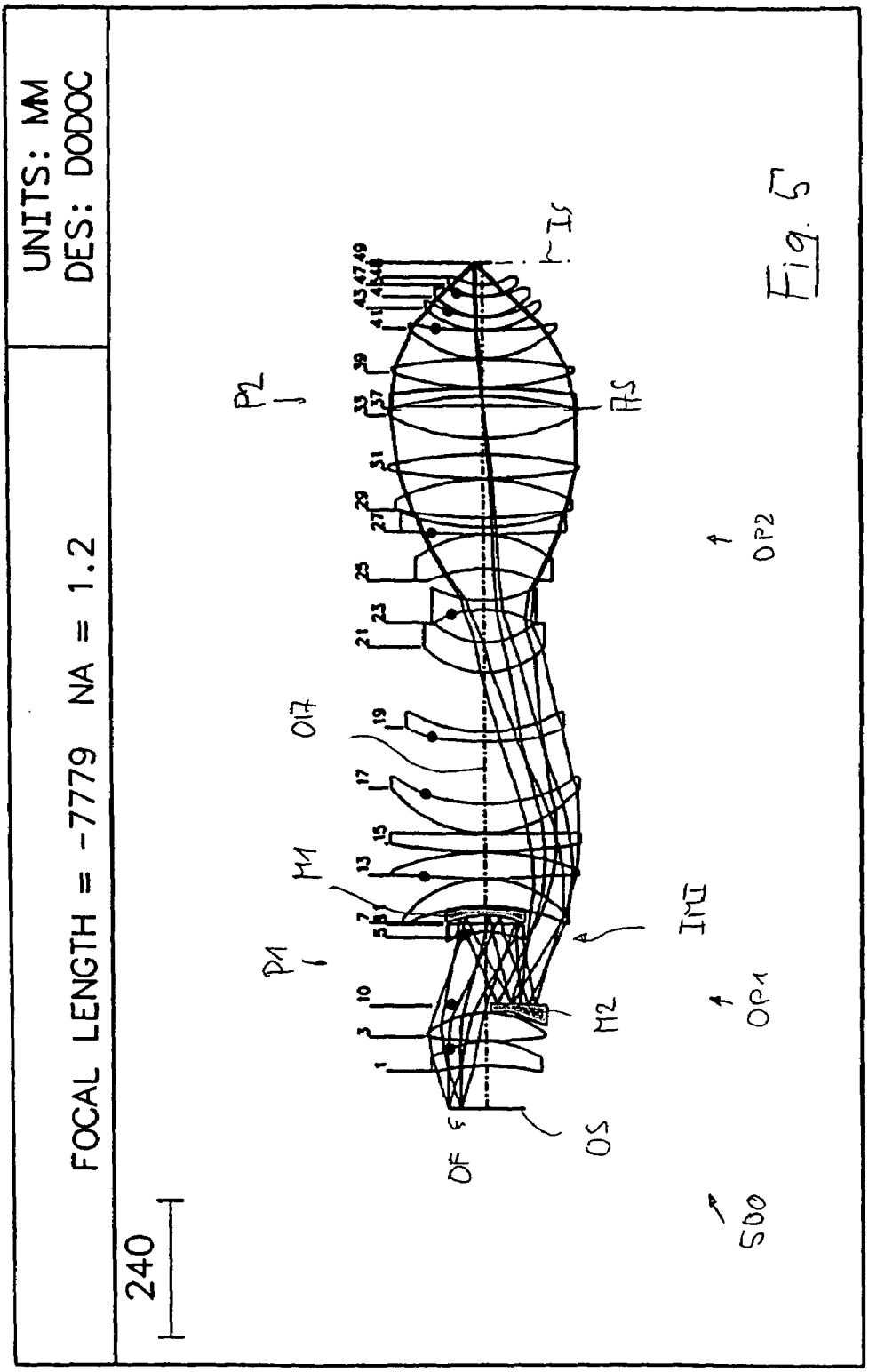
FIG. 5 shows a meridional lens section of a third embodiment of a catadioptric in-line projection objective.

The projection objective 500 in FIG. 5 is a variant of the basic design of FIG. 3 adapted for use with a high-index immersion liquid to be filled in a plano-convex interspace between the last optical element LOE formed by a positive meniscus lens made of fused silica having a concave exit side facing the image surface, and the image surface as shown schematically in FIG. 2(b). A high-index immersion liquid with $n_{HI}$=1.702 is used.

Figure 6:
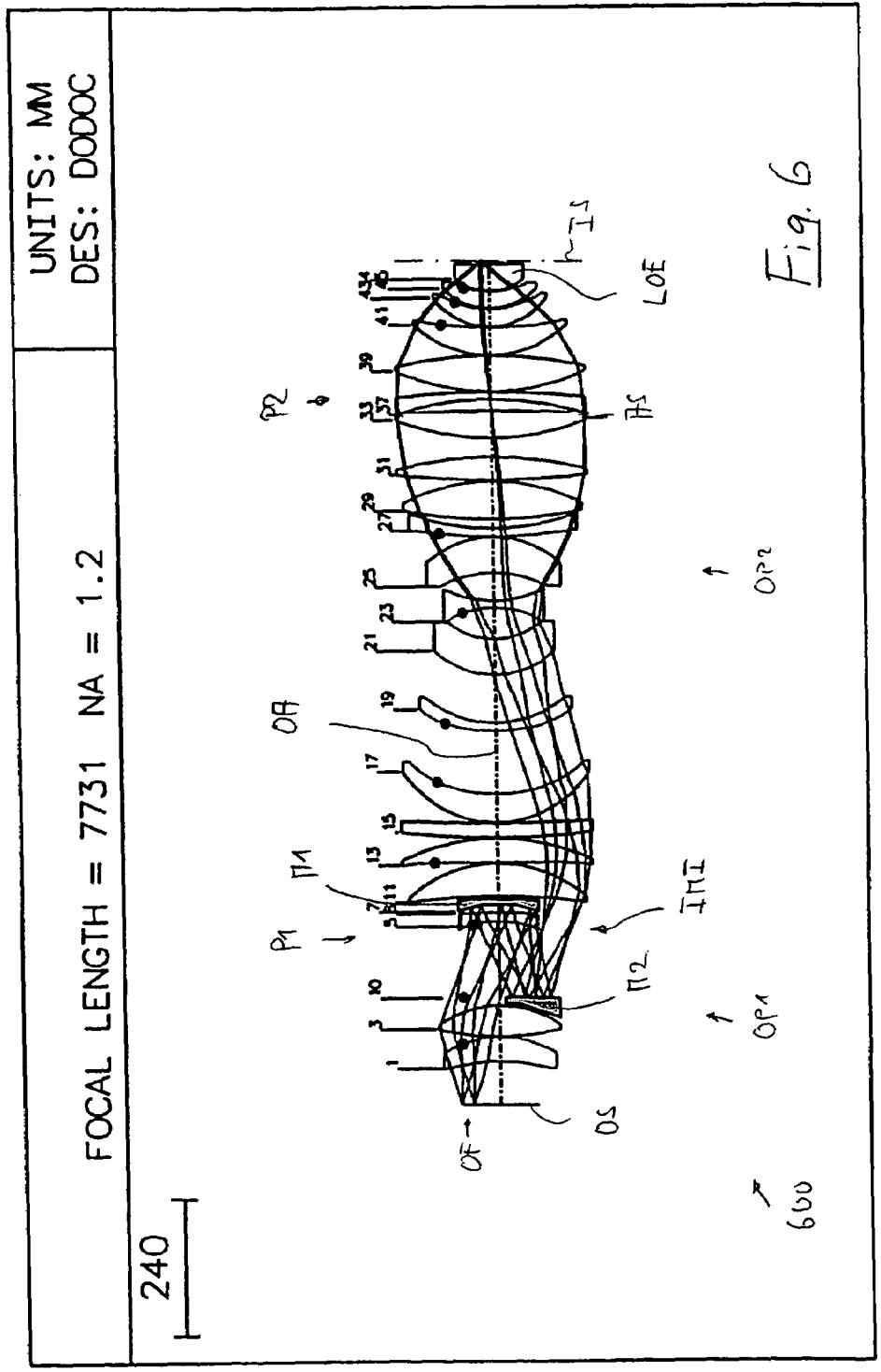
FIG. 6 shows a meridional lens section of a fourth embodiment of a catadioptric in-line projection objective.

The projection objective 600 in FIG. 6 is a variant of the design of FIG. 3 adapted for use with a single layer of high-index immersion liquid to be filled in a uniformly thick interspace between a planar exit surface of the last optical element LOE and the planar image surface in accordance with FIG. 2(d). The refractive index of the piano-convex last optical element LOE made of fused silica ($n_{SIO2}$=1.561) and the refractive index $n_{HI}$=1.597 of the doped water used as immersion liquid are essentially the same (refractive index difference $\Delta n$=0.036). Manufacturing tolerances for the last optical element can be relaxed due to the small difference in refractive index.

Figure 11:
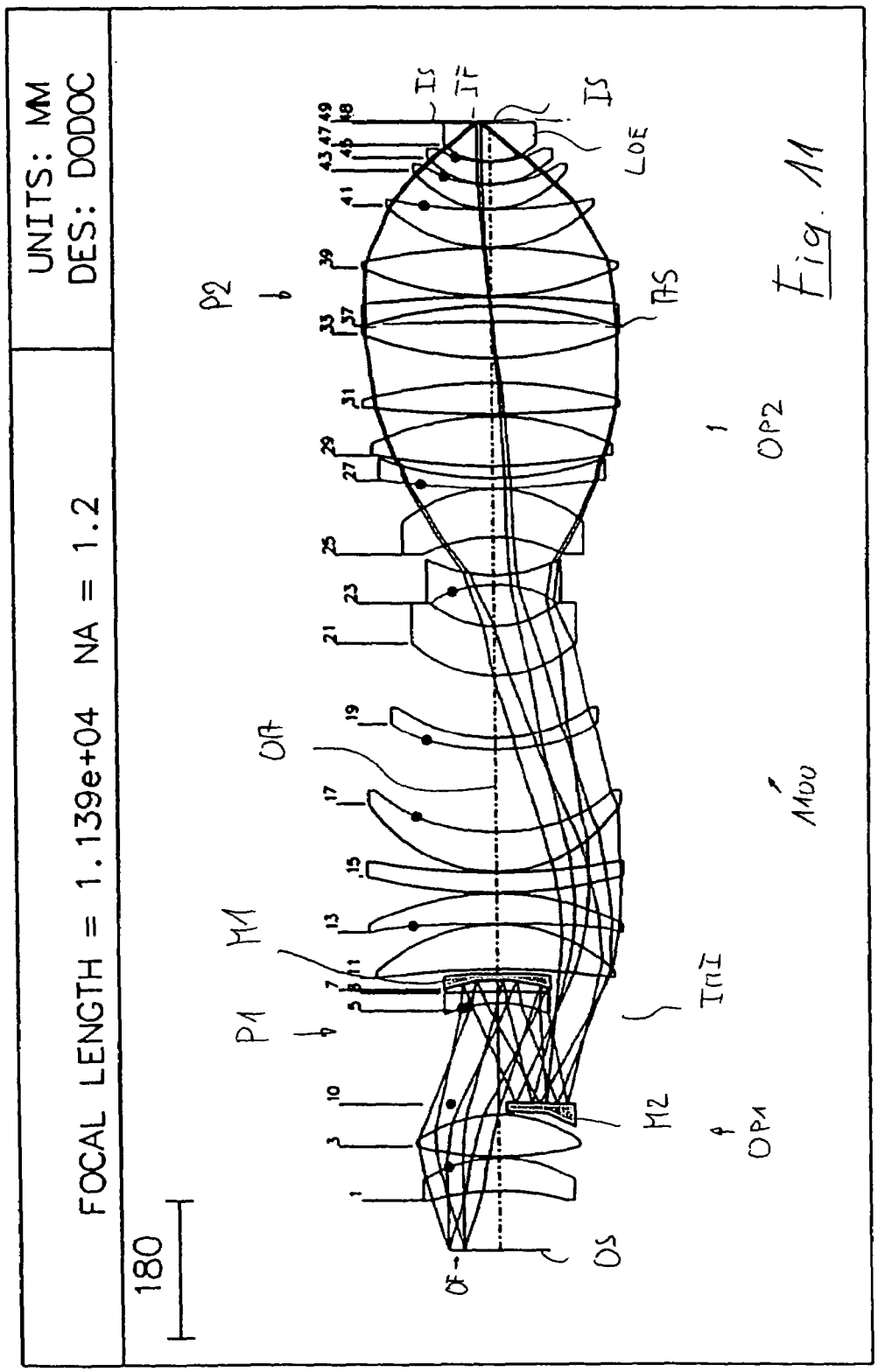
FIG. 11 shows a meridional lens section of a variant of the fourth embodiment of a catadioptric in-line projection objective.

The specification of a variant of the projection objective 600 adapted to pure water (n≈1.437) as an immersion liquid is given in tables 11, 11A. The number and sequence as well as the type (general shape) of lenses and mirrors are the same as in the embodiment of FIG. 6, as seen in FIG. 11. In contradistinction to that embodiment, the planoconvex lens forming the last optical element is made of fused silica. No high-index material is used in that embodiment.

Figure 7:
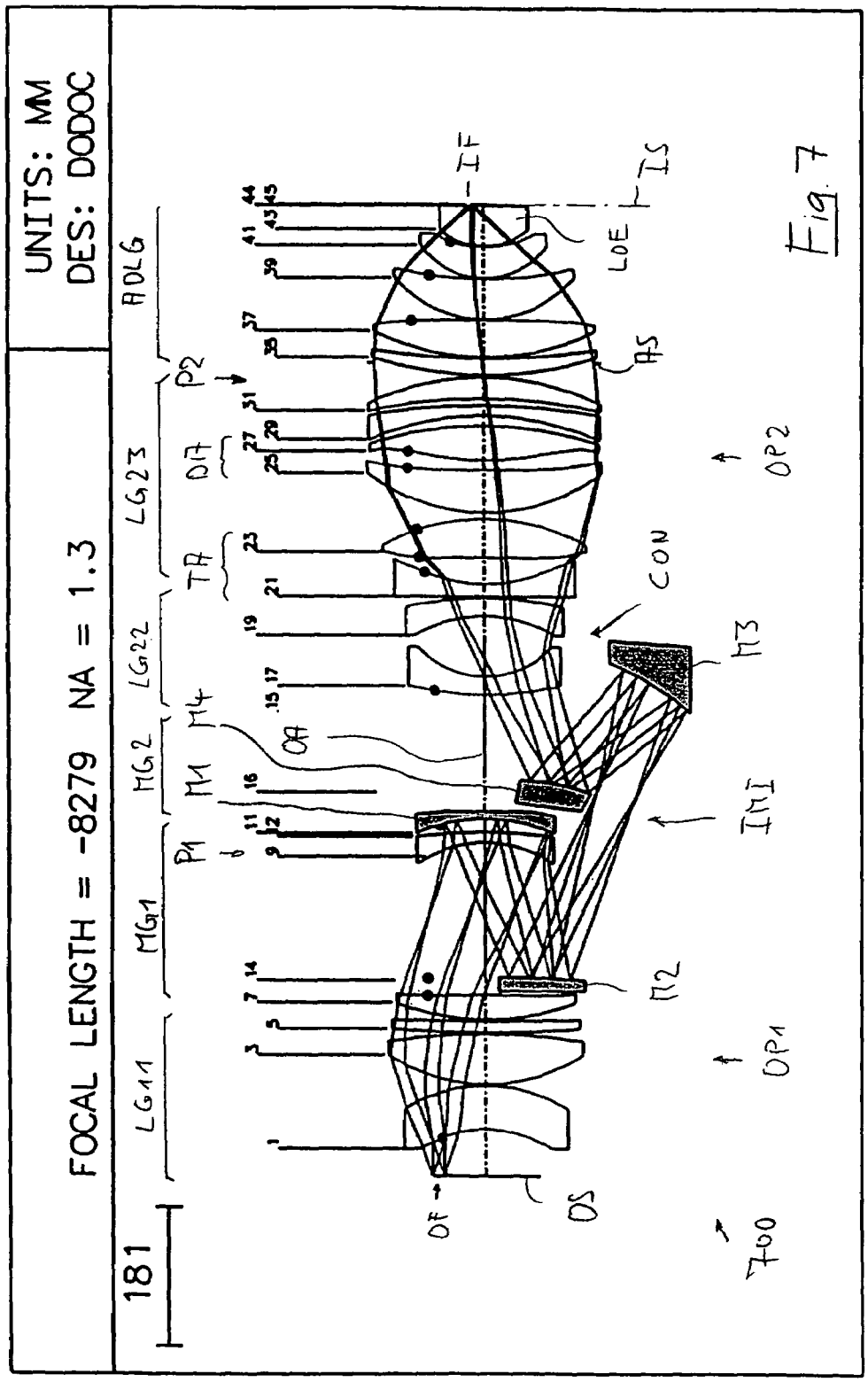
FIG. 7 shows a meridional lens section of a fifth embodiment of a catadioptric in-line projection objective.

The projection objective 700 in FIG. 7 is an representative example of a second design type of a catadioptric projection objective according to the invention. The embodiment is adapted for immersion lithography using pure water (n≈1.437) as an immersion liquid at NA=1.3. A plano-convex lens made of a high-index solid ($n_{HI}$=1.786) forms the last optical element LOE. A first, catadioptric objective part OP1 is designed to image the off-axis object field OF into the only intermediate image IMI at an enlarging scale ($\beta_1$=−3.23). A second, catadioptric objective part OP2 is designed to image the intermediate image onto the image field IF at a reducing scale (($\beta_2$=−0.077). In the first objective part, a refractive first lens group LG11 having positive refractive power is designed to converge the radiation towards a first, concave mirror M1 of mirror group MG1, in front of which a negative meniscus lens is situated. Radiation reflected from first mirror M1 is directed at second mirror M2 having a slightly convex mirror surface facing the image side. Whereas the first mirror M1 is situated on the optical axis optically close to the first pupil surface P1, the second mirror M2 is off-axis and optically close to a field surface (intermediate image IMI).

In the entry region of second objective part OP2 a second mirror group MG2 including a third mirror M3 having a concave mirror surface facing the object side and a fourth mirror M4 having a convex mirror surface facing the image-side are designed to converge the radiation towards a second lens group LG22 including three consecutive negative meniscus lenses, whereby a constriction CON characterized by a local minimum in beam diameter is created. A third lens group LG23 having positive refractive power, and an aperture-defining lens group ADLG having positive refractive power are designed to converge the radiation towards the image surface. An aperture stop AS is positioned close to an image-side pupil surface P2 situated between a third lens group LG23 and the aperture-defining lens group ADLG.

By comparing the basic construction of embodiments shown in FIG. 3 to FIG. 7 with this configuration, it appears that the function of refractive lens group LG21 provided in that embodiment is at least partly performed now by the second mirror group MG2 at the entry of the second objective part. It is a characterizing feature that at least three negative lenses are provided between the fourth mirror M4 and the image-side pupil surface P2. Specifically, the three consecutive negative lenses in the constriction region CON contribute significantly to spherical aberration, coma and Petzval sum correction. Further, the second objective part OP2 is characterized by a large density of aspheric surfaces. Specifically, a triple asphere TA including three consecutive aspheric surfaces (surfaces 22, 23 and 24) is provided in a transition region between negative lens group LG22 and positive lens group LG23, which opens with a bi-aspherical positive lens (surfaces 23, 24). A double asphere DA is formed by facing optical surfaces of the following lenses (surfaces 26, 27). Three consecutive aspheric lenses, each having an aspherical exit surface facing the image surface, are provided in the aperture-defining lens group ADLG. As a consequence, a second objective part OB2 includes a number $N_{ASP}$=9 aspheric lens surfaces and a number $N_{ASPL}=8$ lenses having at least one aspheric lens surface. Therefore, the asphere ratio $AR=N_{ASP}/N_{ASPL}=1.125$ in the second objective part, which forms an imaging subsystem within the projection objective 700.

The specification of a variant of the projection objective 700 also adapted to pure water (n≈1.437) as an immersion liquid is given in tables 12, 12A. The number and sequence as well as the type (general shape) of lenses and mirrors are the same as in the embodiment of FIG. 7, as seen in FIG. 12. In contradistinction to that embodiment, the plano-convex lens forming the last optical element is made of fused silica. No high-index material is used in that embodiment.

The projection objective 800 is designed for solid immersion in accordance with FIG. 2(*a*), where the planar exit surface of the plano-convex last optical element LOE is brought in contact with the surface of the substrate to be exposed. Whereas the last but one positive lens PL is made of fused silica, the last optical element LOE is made of a solid high-index material having $n_{HI}=1.760$. Although an image-side numerical aperture in the order of NA>1.6 may be obtained under this condition, the actual value is confined to NA=1.3. The high-index last optical element enables to combine this high NA-value with relatively small propagation angles of radiation upstream of the last optical element within the aperture-defining lens group ADLG, which therefore may be designed in a relaxed manner with large focal length and sufficient space for lenses, including three aspherical lenses for correcting the pupil imaging between the image-side pupil surface P2 and the image surface.

Figure 8:
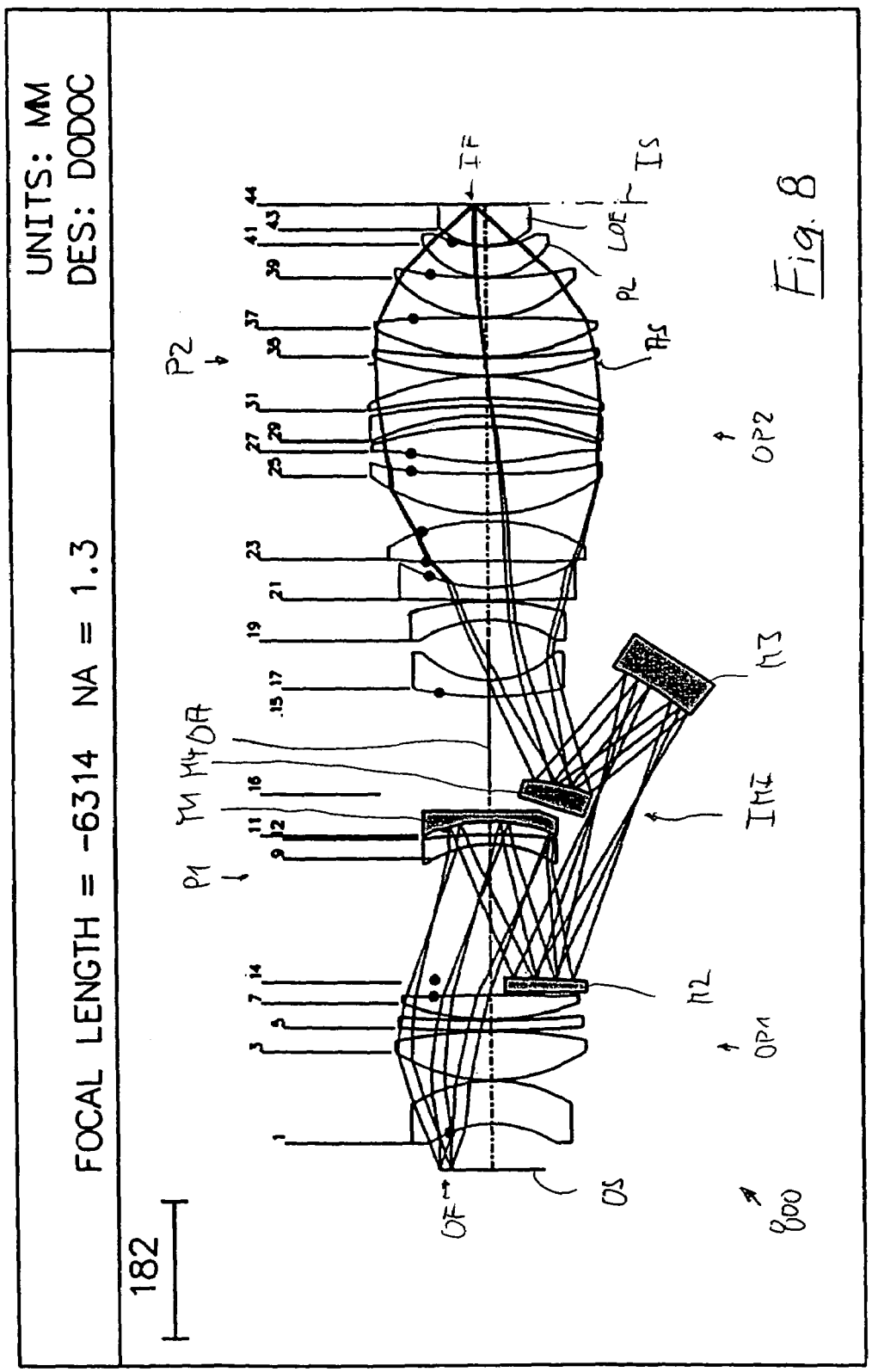
FIG. 8 shows a meridional lens section of a sixth embodiment of a catadioptric in-line projection objective.
Figure 9:
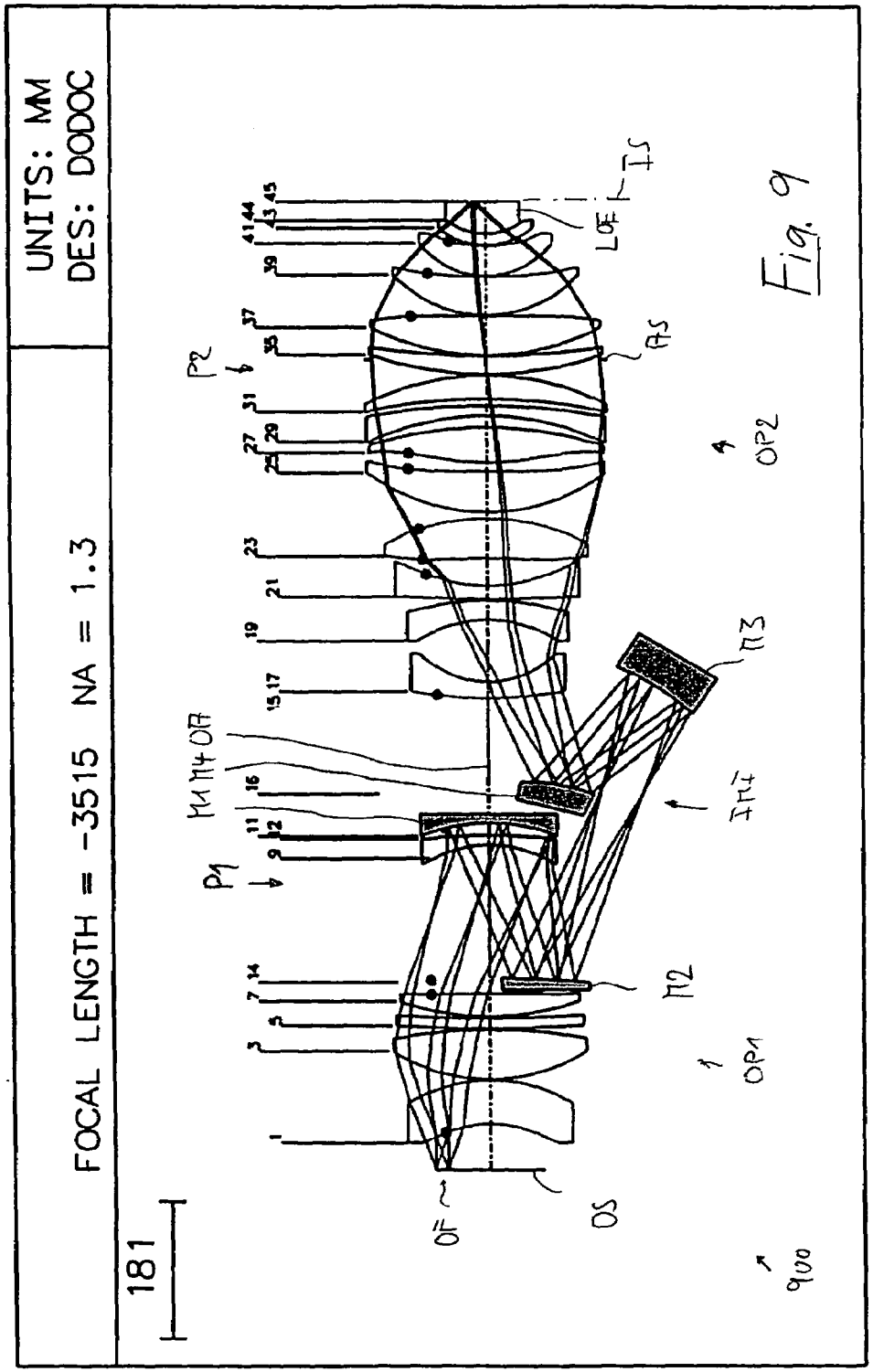
FIG. 9 shows a meridional lens section of a seventh embodiment of a catadioptric in-line projection objective.

Projection objective 900 of FIG. 9 is a variant of projection objective 800 of FIG. 8, where the most significant difference lies in the construction of the image-side end of the projection objective, which is designed generally in accordance with FIG. 2(*b*) to be used with a high-index immersion liquid in a piano-convex space between a concave exit surface of the last optical element LOE (made of fused silica) and the image surface.

Figure 10:
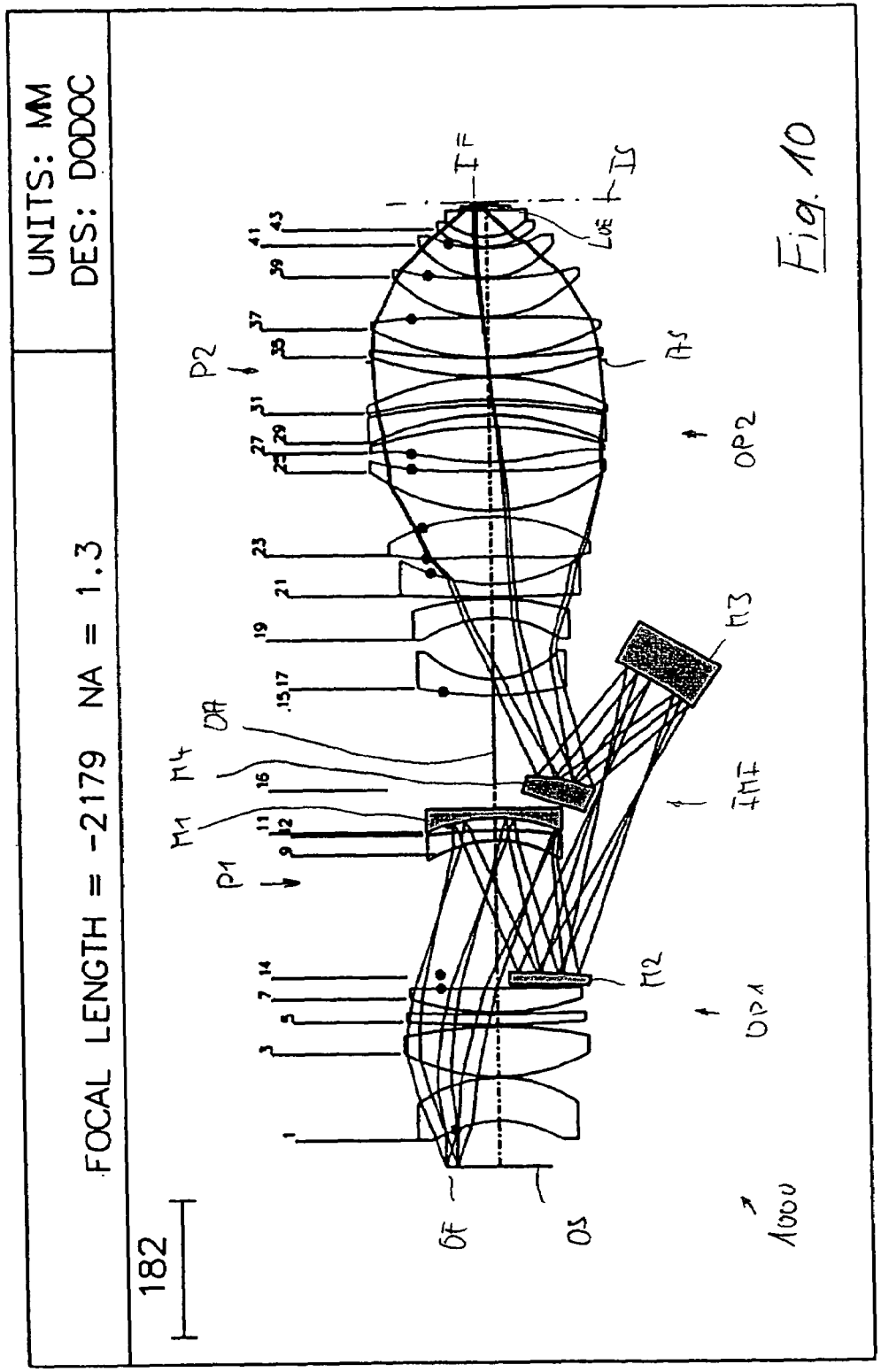
FIG. 10 shows a meridional lens section of an eighth embodiment of a catadioptric in-line projection objective.

The projection objective 1000 in FIG. 10 is a variant of the embodiment shown in FIG. 8 designed on the image-side end for double-immersion generally in accordance with FIG. 2(*c*). In operation, the image-side end has, in that sequence, a last optical element LOE designed as a positive meniscus lens having a concave exit surface, a plano-convex immersion space filled with a high-index immersion liquid with $n_{HI}=1.751$, a plane parallel plate PL of fused silica, a second, plane parallel space filled with immersion liquid with $n_{HI}=1.751$, adjacent to the image surface. As explained above, problems originating in contamination of the optical surfaces at the image end and problems originating from non-uniform liquid flow and temperature conditions within the immersion liquid can be largely avoided if double-immersion is used instead of single immersion as shown, for example, in FIG. 2(*b*).

As mentioned earlier, the invention allows to built catadioptric projection objectives with high numerical aperture, particularly allowing immersion lithography at numerical apertures NA>1, that can be built with relatively small amounts of optical material. The potential for small material consumption is demonstrated in the following considering parameters describing the fact that particularly compact projection objectives can be manufactured.

Generally, the dimensions of projection objectives tend to increase dramatically as the image side numerical aperture NA is increased. Empirically it has been found that the maximum lens diameter $D_{max}$ tends to increase stronger than linear with increase of NA according to $D_{max} \sim NA^k$, where k>1. A value k=2 is an approximation used for the purpose of this application. Further, it has been found that the maximum lens diameter $D_{max}$ increases in proportion to the image field size (represented by the image field height Y', where Y' is the maximum distance between an image field point and the optical axis). A linear dependency is assumed for the purpose of the application. Based on these considerations a first compactness parameter COMP1 is defined as:

$$COMP1=D_{max}/(Y' \cdot NA^2).$$

It is evident that, for given values of image field height and numerical aperture, the first compaction parameter COMP1 should be as small as possible if a compact design is desired.

Considering the overall material consumption necessary for providing a projection objective, the absolute number of lenses, $N_L$ is also relevant. Typically, systems with a smaller number of lenses are preferred to systems with larger numbers of lenses. Therefore, a second compactness parameter COMP2 is defined as follows:

$$COMP2=COMP1 \cdot N_L.$$

Again, small values for COMP2 are indicative of compact optical systems.

Further, projection objectives according to preferred embodiments of the invention have at least two objective parts for imaging an entry side field surface into an optically conjugate exit side field surface, where the imaging objective parts are concatenated at intermediate images. Typically, the number of lenses and the overall material necessary to build an projection objective will increase the higher the number $N_{OP}$ of imaging objective parts of the optical system is. It is desirable to keep the average number of lenses per objective part, $N_L/N_{OP}$, as small as possible. Therefore, a third compactness parameter COMP3 is defined as follows:

$$COMP3=COMP1 \cdot N_L/N_{OP}.$$

Again, projection objectives with low optical material consumption will be characterized by small values of COMP3.

Table 13 summarizes the values necessary to calculate the compactness parameters COMP1, COMP2, COMP3 and the respective values for these parameters for each of the systems presented with a specification table (the table number (corresponding to the same number of a figure) is given in column 1 of table 13). Therefore, in order to obtain a compact catadioptric projection objective having at least one concave mirror and at least two imaging objective parts (i.e. at least one intermediate image) at least one of the following conditions should be observed:

COMP1<15

Preferably COMP1<14 should be observed. This limit applies particularly for two-mirror systems (i.e. catadioptric projection objectives having two concave mirrors).

In four mirror-systems (such as shown in FIGS. 7 to 10 and 12) the design can be even more compact when COMP 1 is considered. Preferably the condition

COMP1<12 should be observed, where preferably COMP1<11 may apply.

Table 13 shows that preferred embodiments according to the invention generally observe at least one of these conditions indicating that compact designs with moderate material consumption are obtained according to the design rules laid out in this specification.

The principles of the invention have been explained using high-NA catadioptric projection objectives designed for immersion lithography at NA>1. The invention can also be utilized in "dry systems", i.e. in catadioptric projection objectives with NA<1 having an image side working distance which is filled with a gas during operation.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all changes and modifications as fall within the spirit and scope of the invention, as defined by the appended claims, and equivalents thereof.

The content of all the claims is made part of this description by reference.

TABLE 3

| Surface | Radius | | Thickness | Material | Index 193.368 nm | Semidiameter |
|---|---|---|---|---|---|---|
| 1 | −404.542022 | | 36.232225 | SIO2 | 1.56078570 | 88.996 |
| 2 | −184.402723 | AS | 1.000090 | AIR | 1.00000000 | 95.088 |
| 3 | 674.592973 | | 51.347982 | SIO2 | 1.56078570 | 102.076 |
| 4 | −174.232362 | | 144.581202 | AIR | 1.00000000 | 102.829 |
| 5 | −162.800929 | AS | 14.999049 | CAF2 | 1.50185255 | 53.189 |
| 6 | −1456.920767 | | 15.293417 | AIR | 1.00000000 | 63.896 |
| 7 | −202.841004 | | −15.293417 | REFL | 1.00000000 | 67.884 |
| 8 | −1456.920767 | | −14.999049 | CAF2 | 1.50185255 | 67.836 |
| 9 | −162.800929 | AS | −129.581898 | AIR | 1.00000000 | 67.241 |
| 10 | −2538.490880 | AS | 174.873667 | REFL | 1.00000000 | 89.519 |
| 11 | −391.507349 | | 46.632422 | SIO2 | 1.56078570 | 140.865 |
| 12 | −195.389639 | | 0.999852 | AIR | 1.00000000 | 144.625 |
| 13 | 1411.077988 | AS | 41.703225 | SIO2 | 1.56078570 | 160.805 |
| 14 | −529.305238 | | 0.999461 | AIR | 1.00000000 | 162.519 |
| 15 | 1458.778723 | | 34.033769 | SIO2 | 1.56078570 | 165.701 |
| 16 | −3002.433858 | | 1.088813 | AIR | 1.00000000 | 166.002 |
| 17 | 212.825771 | | 57.638065 | SIO2 | 1.56078570 | 165.361 |
| 18 | 436.070633 | AS | 107.276235 | AIR | 1.00000000 | 157.551 |
| 19 | 807.065576 | AS | 13.824876 | SIO2 | 1.56078570 | 136.972 |
| 20 | 290.022861 | | 105.550931 | AIR | 1.00000000 | 129.323 |
| 21 | 153.210365 | | 45.794134 | SIO2 | 1.56078570 | 102.069 |
| 22 | 136.220631 | | 56.777310 | AIR | 1.00000000 | 85.525 |
| 23 | −236.154610 | AS | 16.122149 | SIO2 | 1.56078570 | 84.150 |
| 24 | 196.227428 | | 58.167782 | AIR | 1.00000000 | 89.217 |
| 25 | −225.833560 | | 59.831340 | SIO2 | 1.56078570 | 97.239 |
| 26 | −193.684381 | | 3.215861 | AIR | 1.00000000 | 118.689 |
| 27 | 1270.382760 | AS | 13.092290 | SIO2 | 1.56078570 | 138.308 |
| 28 | 444.089768 | | 15.430530 | AIR | 1.00000000 | 145.054 |
| 29 | 798.722954 | | 70.490347 | SIO2 | 1.56078570 | 148.503 |
| 30 | −372.865243 | | 1.829734 | AIR | 1.00000000 | 155.186 |
| 31 | 1055.533545 | | 39.622524 | SIO2 | 1.56078570 | 165.276 |
| 32 | −843.038518 | | 36.110674 | AIR | 1.00000000 | 165.999 |
| 33 | 397.601006 | | 52.148862 | SIO2 | 1.56078570 | 165.961 |
| 34 | −2316.548771 | | −4.213465 | AIR | 1.00000000 | 164.343 |
| 35 | 0.000000 | | 0.000000 | AIR | 1.00000000 | 163.851 |
| 36 | 0.000000 | | 24.329363 | AIR | 1.00000000 | 163.851 |
| 37 | −584.913340 | | 13.012880 | SIO2 | 1.56078570 | 163.706 |
| 38 | −1175.679472 | | 0.999882 | AIR | 1.00000000 | 163.968 |
| 39 | 468.096624 | | 53.626064 | SIO2 | 1.56078570 | 161.375 |
| 40 | −861.698483 | | 0.999930 | AIR | 1.00000000 | 159.675 |
| 41 | 199.043165 | | 50.143874 | SIO2 | 1.56078570 | 132.604 |
| 42 | 1068.213664 | AS | 0.999723 | AIR | 1.00000000 | 126.983 |
| 43 | 159.145519 | | 28.472240 | SIO2 | 1.56078570 | 103.283 |
| 44 | 185.472842 | AS | 1.000460 | AIR | 1.00000000 | 90.240 |
| 45 | 118.935626 | | 36.986741 | CAF2 | 1.50185255 | 82.041 |
| 46 | 183.063185 | AS | 1.167554 | AIR | 1.00000000 | 65.440 |
| 47 | 108.701433 | | 56.721488 | HIINDEX1 | 1.70196985 | 58.621 |
| 48 | 0.000000 | | 1.996512 | HIINDEX2 | 1.59667693 | 18.135 |

TABLE 3A

| | Aspheric Constants | | | | |
|---|---|---|---|---|---|
| | | | SRF | | |
| | 2 | 5 | 9 | 10 | 13 |
| K | 0 | 0 | 0 | 0 | 0 |
| C1 | −2.722625e−09 | 1.960629e−08 | 1.960629e−08 | −2.009517e−09 | 4.688860e−12 |
| C2 | 7.584994e−13 | 7.765801e−13 | 7.765801e−13 | −9.097265e−14 | −1.731249e−13 |
| C3 | 9.846612e−17 | 1.917740e−17 | 1.917740e−17 | −8.260726e−18 | −6.240777e−19 |
| C4 | 6.877818e−21 | 2.910700e−22 | 2.910700e−22 | 5.085547e−23 | 4.036403e−23 |
| C5 | 1.011674e−24 | 1.224735e−25 | 1.224735e−25 | −1.203685e−26 | −1.100969e−27 |
| C6 | −1.051032e−29 | −3.426250e−30 | −3.426250e−30 | −9.728791e−31 | 5.706583e−33 |
| C7 | 0.000000e+00 | 0.000000e+00 | 0.000000e+00 | 0.000000e+00 | 0.000000e+00 |

TABLE 3A-continued

Aspheric Constants

| | | | | | |
|---|---|---|---|---|---|
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

| | SRF | | | | |
|---|---|---|---|---|---|
| | 18 | 19 | 23 | 27 | 42 |
| K | 0 | 0 | 0 | 0 | 0 |
| C1 | 1.982111e−08 | 1.777327e−08 | −1.163364e−07 | −7.203585e−09 | 1.122901e−08 |
| C2 | −8.423501e−14 | 3.329332e−13 | −9.570513e−13 | 1.049118e−13 | −3.595965e−14 |
| C3 | −7.592975e−19 | 2.038481e−20 | 4.236584e−17 | −7.379754e−19 | −2.518839e−18 |
| C4 | 1.931064e−22 | 7.263940e−22 | −7.733258e−22 | 7.196196e−23 | 4.313506e−22 |
| C5 | −5.204262e−27 | −3.379214e−26 | 2.136062e−26 | −9.945374e−28 | −1.564968e−26 |
| C6 | 8.863320e−32 | 6.878653e−31 | 1.705507e−30 | 4.329096e−32 | 3.223390e−31 |
| C7 | 0.000000e+00 | 0.000000e+00 | 0.000000e+00 | 0.000000e+00 | 0.000000e+00 |
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

| | SRF | |
|---|---|---|
| | 44 | 46 |
| K | 0 | 0 |
| C1 | 1.449926e−08 | 6.313252e−08 |
| C2 | 5.832083e−13 | 1.940331e−12 |
| C3 | 6.975570e−17 | −2.373686e−16 |
| C4 | 3.546013e−21 | −1.406348e−21 |
| C5 | −1.283131e−26 | −1.469813e−25 |
| C6 | 1.520482e−29 | 9.584030e−29 |
| C7 | 0.000000e+00 | 0.000000e+00 |
| C8 | 0.000000e+00 | 0.000000e+00 |
| C9 | 0.000000e+00 | 0.000000e+00 |

TABLE 4

| Surface | Radius | | Thickness | Material | Index 193.368 nm | Semidiameter |
|---|---|---|---|---|---|---|
| 1 | −414.121100 | | 42.366173 | SIO2 | 1.56078570 | 88.595 |
| 2 | −180.398286 | AS | 0.997246 | AIR | 1.00000000 | 95.880 |
| 3 | 672.276124 | | 51.013183 | SIO2 | 1.56078570 | 102.455 |
| 4 | −176.777070 | | 141.655598 | AIR | 1.00000000 | 103.078 |
| 5 | −155.975967 | AS | 14.997355 | CAF2 | 1.50185255 | 51.750 |
| 6 | −1379.092049 | | 14.967737 | AIR | 1.00000000 | 62.450 |
| 7 | −199.579690 | | −14.967737 | REFL | 1.00000000 | 66.450 |
| 8 | −1379.092049 | | −14.997355 | CAF2 | 1.50185255 | 66.430 |
| 9 | −155.975967 | AS | −126.660492 | AIR | 1.00000000 | 65.918 |
| 10 | −2739.696693 | AS | 171.620690 | REFL | 1.00000000 | 89.015 |
| 11 | −377.604010 | | 48.768472 | SIO2 | 1.56078570 | 140.210 |
| 12 | −192.471339 | | 1.143047 | AIR | 1.00000000 | 144.656 |
| 13 | 1832.945177 | AS | 45.701706 | SIO2 | 1.56078570 | 159.912 |
| 14 | −432.630174 | | 1.309799 | AIR | 1.00000000 | 162.061 |
| 15 | 960.131289 | | 33.354459 | SIO2 | 1.56078570 | 165.645 |
| 16 | 13106.162262 | | 1.201087 | AIR | 1.00000000 | 165.350 |
| 17 | 211.754857 | | 52.094947 | SIO2 | 1.56078570 | 164.107 |
| 18 | 368.724438 | AS | 111.692117 | AIR | 1.00000000 | 156.247 |
| 19 | 695.817447 | AS | 18.634797 | SIO2 | 1.56078570 | 137.290 |
| 20 | 273.576995 | | 102.726199 | AIR | 1.00000000 | 128.441 |
| 21 | 153.882013 | | 53.558789 | SIO2 | 1.56078570 | 103.781 |
| 22 | 134.234534 | | 55.463264 | AIR | 1.00000000 | 84.662 |
| 23 | −264.669591 | AS | 13.022221 | SIO2 | 1.56078570 | 83.344 |
| 24 | 199.502999 | | 58.221149 | AIR | 1.00000000 | 88.287 |
| 25 | −239.260240 | | 59.896334 | SIO2 | 1.56078570 | 97.407 |
| 26 | −196.613503 | | 1.765954 | AIR | 1.00000000 | 118.186 |
| 27 | 1196.470171 | AS | 13.989223 | SIO2 | 1.56078570 | 136.152 |
| 28 | 432.693820 | | 16.877009 | AIR | 1.00000000 | 143.023 |
| 29 | 868.369835 | | 68.316963 | SIO2 | 1.56078570 | 146.466 |
| 30 | −368.754428 | | 3.325465 | AIR | 1.00000000 | 153.285 |
| 31 | 948.367854 | | 41.454358 | SIO2 | 1.56078570 | 164.595 |
| 32 | −811.359547 | | 21.980014 | AIR | 1.00000000 | 165.329 |
| 33 | 379.644456 | | 54.827896 | SIO2 | 1.56078570 | 165.179 |
| 34 | −2000.974239 | | −5.709303 | AIR | 1.00000000 | 163.419 |
| 35 | 0.000000 | | 0.000000 | AIR | 1.00000000 | 163.100 |
| 36 | 0.000000 | | 22.976075 | AIR | 1.00000000 | 163.100 |
| 37 | −613.803055 | | 12.999109 | SIO2 | 1.56078570 | 162.929 |

TABLE 4-continued

| Surface | Radius | | Thickness | Material | Index 193.368 nm | Semidiameter |
|---|---|---|---|---|---|---|
| 38 | −1347.086830 | | 1.077015 | AIR | 1.00000000 | 162.653 |
| 39 | 507.225908 | | 51.105620 | SIO2 | 1.56078570 | 159.495 |
| 40 | −817.071242 | | 1.390689 | AIR | 1.00000000 | 157.771 |
| 41 | 186.916911 | | 50.121407 | SIO2 | 1.56078570 | 129.074 |
| 42 | 751.052938 | AS | 0.999451 | AIR | 1.00000000 | 123.165 |
| 43 | 154.750641 | | 22.396936 | SIO2 | 1.56078570 | 100.269 |
| 44 | 200.808041 | AS | 0.999869 | AIR | 1.00000000 | 91.478 |
| 45 | 121.066042 | | 34.146717 | CAF2 | 1.50185255 | 82.634 |
| 46 | 169.446884 | AS | 1.216841 | AIR | 1.00000000 | 66.454 |
| 47 | 103.838634 | | 20.583027 | SIO2 | 1.56078570 | 59.765 |
| 48 | 103.718650 | | 26.529620 | HIINDEX1 | 1.70196985 | 46.439 |
| 49 | 0.000000 | | 10.000000 | SIO2 | 1.56078570 | 30.992 |
| 50 | 0.000000 | | 1.996512 | HIINDEX1 | 1.70196985 | 18.983 |
| 51 | 0.000000 | | 0.000000 | AIR | 0.00000000 | 17.000 |

TABLE 4A

Aspheric Constants

| | SRF | | | | |
|---|---|---|---|---|---|
| | 2 | 5 | 9 | 10 | 13 |
| K | 0 | 0 | 0 | 0 | 0 |
| C1 | −4.404795e−09 | 2.108903e−08 | 2.108903e−08 | −9.135670e−10 | 1.561215e−10 |
| C2 | 5.820719e−13 | 9.182484e−13 | 9.182484e−13 | −1.409356e−13 | −2.907275e−13 |
| C3 | 8.269357e−17 | 2.420748e−17 | 2.420748e−17 | −6.913194e−18 | 1.928971e−18 |
| C4 | 6.832303e−21 | 3.816551e−22 | 3.816551e−22 | −2.311766e−22 | 1.443299e−23 |
| C5 | 1.109394e−24 | 2.038192e−25 | 2.038192e−25 | 9.899481e−27 | −1.206840e−27 |
| C6 | −1.950134e−29 | −1.306007e−30 | −1.306007e−30 | −2.195577e−30 | 7.504603e−33 |
| C7 | 0.000000e+00 | 0.000000e+00 | 0.000000e+00 | 0.000000e+00 | 0.000000e+00 |
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

| | SRF | | | | |
|---|---|---|---|---|---|
| | 18 | 19 | 23 | 27 | 42 |
| K | 0 | 0 | 0 | 0 | 0 |
| C1 | 2.067993e−08 | 2.125729e−08 | −1.336932e−07 | −8.139318e−09 | 5.632057e−09 |
| C2 | −1.794696e−13 | 1.937856e−13 | −1.521795e−12 | 9.789279e−14 | −6.884692e−18 |
| C3 | 1.805678e−19 | 3.281010e−21 | 2.384680e−17 | −1.958751e−18 | −3.284658e−18 |
| C4 | 2.458151e−22 | 1.028071e−21 | −5.679311e−22 | 1.143247e−22 | 8.247569e−22 |
| C5 | −6.710693e−27 | −4.445379e−26 | −4.218802e−25 | −2.199820e−27 | −3.538280e−26 |
| C6 | 1.159381e−31 | 8.293984e−31 | 3.402670e−29 | 7.977100e−32 | 7.399992e−31 |
| C7 | 0.000000e+00 | 0.000000e+00 | 0.000000e+00 | 0.000000e+00 | 0.000000e+00 |
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

| | SRF | |
|---|---|---|
| | 44 | 46 |
| K | 0 | 0 |
| C1 | 1.802314e−08 | 7.847301e−08 |
| C2 | 1.052624e−12 | 1.326566e−12 |
| C3 | 1.095964e−16 | −3.074253e−16 |
| C4 | 3.351062e−21 | 1.612295e−20 |
| C5 | −1.457987e−25 | −4.631529e−24 |
| C6 | 3.258770e−29 | 5.629462e−28 |
| C7 | 0.000000e+00 | 0.000000e+00 |
| C8 | 0.000000e+00 | 0.000000e+00 |
| C9 | 0.000000e+00 | 0.000000e+00 |

TABLE 5

| Surface | Radius | | Thickness | Material | Inex 193.368 nm | Semidiameter |
|---|---|---|---|---|---|---|
| 1 | −451.633069 | | 41.847802 | SIO2 | 1.56078570 | 88.846 |
| 2 | −179.764443 | AS | 0.997865 | AIR | 1.00000000 | 95.677 |
| 3 | 788.811739 | | 49.515274 | SIO2 | 1.56078570 | 101.750 |
| 4 | −175.765286 | | 142.344513 | AIR | 1.00000000 | 102.424 |
| 5 | −152.168282 | AS | 14.999283 | CAF2 | 1.50185255 | 52.217 |
| 6 | −1224.296886 | | 15.148776 | AIR | 1.00000000 | 63.166 |
| 7 | −197.634797 | | −15.148776 | REFL | 1.00000000 | 67.215 |
| 8 | −1224.296886 | | −14.999283 | CAF2 | 1.50185255 | 67.146 |
| 9 | −152.168282 | AS | −127.348415 | AIR | 1.00000000 | 66.389 |
| 10 | −2297.976026 | AS | 172.492572 | REFL | 1.00000000 | 88.913 |
| 11 | −363.177979 | | 48.449667 | SIO2 | 1.56078570 | 140.748 |
| 12 | −191.107660 | | 0.999511 | AIR | 1.00000000 | 145.196 |
| 13 | 1371.212896 | AS | 46.493123 | SIO2 | 1.56078570 | 160.992 |
| 14 | −443.917203 | | 1.000590 | AIR | 1.00000000 | 162.829 |
| 15 | 1036.740259 | | 32.622427 | SIO2 | 1.56078570 | 166.016 |
| 16 | 18207.832821 | | 1.096839 | AIR | 1.00000000 | 165.744 |
| 17 | 215.621498 | | 52.169416 | SIO2 | 1.56078570 | 164.511 |
| 18 | 393.524032 | AS | 111.107168 | AIR | 1.00000000 | 156.872 |
| 19 | 806.536545 | AS | 16.822440 | SIO2 | 1.56078570 | 138.306 |
| 20 | 270.135089 | | 106.851182 | AIR | 1.00000000 | 129.559 |
| 21 | 153.204982 | | 53.733281 | SIO2 | 1.56078570 | 105.125 |
| 22 | 135.178987 | | 57.907901 | AIR | 1.00000000 | 86.138 |
| 23 | −265.940335 | AS | 17.321242 | SIO2 | 1.56078570 | 84.520 |
| 24 | 196.940842 | | 56.734300 | AIR | 1.00000000 | 89.865 |
| 25 | −240.085893 | | 60.203703 | SIO2 | 1.56078570 | 97.829 |
| 26 | −196.482791 | | 1.011366 | AIR | 1.00000000 | 119.023 |
| 27 | 1505.948667 | AS | 13.006909 | SIO2 | 1.56078570 | 137.367 |
| 28 | 436.428499 | | 16.435228 | AIR | 1.00000000 | 144.478 |
| 29 | 837.903006 | | 68.476413 | SIO2 | 1.56078570 | 148.046 |
| 30 | −356.200116 | | 1.277689 | AIR | 1.00000000 | 154.245 |
| 31 | 943.310018 | | 42.390199 | SIO2 | 1.56078570 | 165.276 |
| 32 | −805.249142 | | 28.982667 | AIR | 1.00000000 | 166.006 |
| 33 | 372.901733 | | 57.042107 | SIO2 | 1.56078570 | 165.234 |
| 34 | −2011.241856 | | −5.362421 | AIR | 1.00000000 | 163.126 |
| 35 | 0.000000 | | 0.000000 | AIR | 1.00000000 | 162.695 |
| 36 | 0.000000 | | 22.693554 | AIR | 1.00000000 | 162.695 |
| 37 | −618.137674 | | 13.166607 | SIO2 | 1.56078570 | 162.516 |
| 38 | −1354.641448 | | 1.437096 | AIR | 1.00000000 | 162.047 |
| 39 | 500.325754 | | 50.334013 | SIO2 | 1.56078570 | 158.446 |
| 40 | −848.695041 | | 1.055181 | AIR | 1.00000000 | 156.638 |
| 41 | 190.208184 | | 48.937616 | SIO2 | 1.56078570 | 128.548 |
| 42 | 871.846545 | AS | 0.999300 | AIR | 1.00000000 | 122.700 |
| 43 | 156.573271 | | 23.501019 | SIO2 | 1.56078570 | 100.182 |
| 44 | 190.148325 | AS | 0.999727 | AIR | 1.00000000 | 90.347 |
| 45 | 121.071287 | | 34.552923 | CAF2 | 1.50185255 | 81.853 |
| 46 | 182.689299 | AS | 0.998604 | AIR | 1.00000000 | 65.800 |
| 47 | 105.605176 | | 20.369177 | SIO2 | 1.56078570 | 58.914 |
| 48 | 99.320659 | | 39.009260 | GLASS53 | 1.70196985 | 45.020 |
| 49 | 0.000000 | | 0.000000 | AIR | 0.00000000 | 17.000 |

TABLE 5A

Aspheric Constants

| | SRF | | | | |
|---|---|---|---|---|---|
| | 2 | 5 | 9 | 10 | 13 |
| K | 0 | 0 | 0 | 0 | 0 |
| C1 | −3.874558e−09 | 2.221038e−08 | 2.221038e−08 | −3.922240e−10 | −8.667348e−12 |
| C2 | 8.315942e−13 | 9.873497e−13 | 9.873497e−13 | −1.977352e−13 | −2.555495e−13 |
| C3 | 1.016326e−16 | 3.165387e−17 | 3.165387e−17 | −5.465052e−18 | 1.320002e−18 |
| C4 | 6.175290e−21 | 1.398411e−22 | 1.398411e−22 | −3.354122e−22 | 1.461733e−23 |
| C5 | 1.157104e−24 | 2.420682e−25 | 2.420682e−25 | 1.182185e−26 | −9.502963e−28 |
| C6 | −3.544707e−29 | −4.120639e−30 | −4.120639e−30 | −2.423764e−30 | 5.753067e−33 |
| C7 | 0.000000e+00 | 0.000000e+00 | 0.000000e+00 | 0.000000e+00 | 0.000000e+00 |
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

TABLE 5A-continued

Aspheric Constants

| | SRF | | | | |
|---|---|---|---|---|---|
| | 18 | 19 | 23 | 27 | 42 |
| K | 0 | 0 | 0 | 0 | 0 |
| C1 | 2.045030e−08 | 2.256223e−08 | −1.285703e−07 | −6.512254e−09 | 1.075423e−08 |
| C2 | −1.419891e−13 | 2.739230e−13 | −1.156589e−12 | 1.223304e−13 | −3.072658e−14 |
| C3 | 5.317906e−19 | −3.997897e−22 | 4.892617e−17 | −1.406871e−18 | −7.074621e−18 |
| C4 | 1.512247e−22 | 7.796208e−22 | −1.326371e−21 | 9.709645e−23 | 9.986934e−22 |
| C5 | −3.315707e−27 | −3.395311e−26 | −3.320971e−26 | −1.285907e−27 | −4.000417e−26 |
| C6 | 6.495461e−32 | 6.522368e−31 | 1.382652e−29 | 5.835628e−32 | 8.319761e−31 |
| C7 | 0.000000e+00 | 0.000000e+00 | 0.000000e+00 | 0.000000e+00 | 0.000000e+00 |
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

| | SRF | |
|---|---|---|
| | 44 | 46 |
| K | 0 | 0 |
| C1 | 1.028484e−08 | 8.250136e−08 |
| C2 | 3.036683e−13 | 2.629435e−12 |
| C3 | 1.031272e−16 | −3.068772e−16 |
| C4 | 4.607368e−21 | 2.829771e−21 |
| C5 | −2.568057e−25 | −1.206037e−24 |
| C6 | 2.849902e−29 | 6.211885e−29 |
| C7 | 0.000000e+00 | 0.000000e+00 |
| C8 | 0.000000e+00 | 0.000000e+00 |
| C9 | 0.000000e+00 | 0.000000e+00 |

TABLE 6

| Surface | Radius | Thickness | Material | Index 193.368 nm | Semidiameter |
|---|---|---|---|---|---|
| 1 | −331.000904 | 42.813272 | SIO2 | 1.56078570 | 87.918 |
| 2 | −186.584235 AS | 0.998996 | AIR | 1.00000000 | 96.506 |
| 3 | 456.092636 | 54.350538 | SIO2 | 1.56078570 | 104.559 |
| 4 | −187.509343 | 148.636637 | AIR | 1.00000000 | 104.982 |
| 5 | −167.147346 AS | 14.998818 | CAF2 | 1.50185255 | 53.680 |
| 6 | −1774.729150 | 15.137660 | AIR | 1.00000000 | 64.137 |
| 7 | −210.467126 | −15.137660 | REFL | | 68.006 |
| 8 | −1774.729150 | −14.998818 | CAF2 | 1.50185255 | 68.006 |
| 9 | −167.147346 AS | −133.638684 | AIR | 1.00000000 | 67.649 |
| 10 | −3173.721817 AS | 178.773115 | REFL | | 92.046 |
| 11 | −1077.389521 | 58.402850 | SIO2 | 1.56078570 | 150.422 |
| 12 | −231.757181 | 1.000238 | AIR | 1.00000000 | 154.439 |
| 13 | 9687.226397 AS | 43.632651 | SIO2 | 1.56078570 | 163.998 |
| 14 | −383.748558 | 1.000850 | AIR | 1.00000000 | 165.716 |
| 15 | 1429.968899 | 26.165059 | SIO2 | 1.56078570 | 166.011 |
| 16 | 3898.010913 | 0.999264 | AIR | 1.00000000 | 165.250 |
| 17 | 195.690040 | 51.365518 | SIO2 | 1.56078570 | 162.270 |
| 18 | 307.973470 AS | 112.539955 | AIR | 1.00000000 | 153.025 |
| 19 | 353.925856 AS | 14.621944 | SIO2 | 1.56078570 | 131.543 |
| 20 | 192.060285 | 86.375704 | AIR | 1.00000000 | 122.255 |
| 21 | 155.121944 | 64.250457 | SIO2 | 1.56078570 | 104.326 |
| 22 | 130.619670 | 55.246879 | AIR | 1.00000000 | 81.462 |
| 23 | −219.052805 AS | 13.030104 | SIO2 | 1.56078570 | 80.150 |
| 24 | 194.190299 | 50.223615 | AIR | 1.00000000 | 86.444 |
| 25 | −200.413455 | 63.662787 | SIO2 | 1.56078570 | 91.322 |
| 26 | −177.648047 | 1.036827 | AIR | 1.00000000 | 115.955 |
| 27 | 777.183202 AS | 14.381647 | SIO2 | 1.56078570 | 140.005 |
| 28 | 426.571296 | 16.224176 | AIR | 1.00000000 | 146.424 |
| 29 | 773.106124 | 66.866991 | SIO2 | 1.56078570 | 150.068 |
| 30 | −355.919709 | 2.893664 | AIR | 1.00000000 | 155.097 |
| 31 | 1532.665989 | 40.910666 | SIO2 | 1.56078570 | 164.941 |
| 32 | −669.729091 | 34.068489 | AIR | 1.00000000 | 165.952 |
| 33 | 459.493406 | 48.212313 | SIO2 | 1.56078570 | 165.903 |
| 34 | −2073.015200 | −5.544810 | AIR | 1.00000000 | 164.438 |
| 35 | 0.000000 | 0.000000 | AIR | 1.00000000 | 164.174 |
| 36 | 0.000000 | 26.013038 | AIR | 1.00000000 | 164.174 |
| 37 | −549.643917 | 13.007760 | SIO2 | 1.56078570 | 164.053 |
| 38 | −1478.808572 | 1.037593 | AIR | 1.00000000 | 165.026 |
| 39 | 402.404594 | 63.032812 | SIO2 | 1.56078570 | 164.560 |
| 40 | −758.807583 | 1.004453 | AIR | 1.00000000 | 162.896 |

TABLE 6-continued

| Surface | Radius | | Thickness | Material | Index 193.368 nm | Semidiameter |
|---|---|---|---|---|---|---|
| 41 | 199.150466 | | 49.164957 | SIO2 | 1.56078570 | 133.403 |
| 42 | 976.072546 | AS | 0.999907 | AIR | 1.00000000 | 127.646 |
| 43 | 126.061354 | | 31.719144 | SIO2 | 1.56078570 | 98.206 |
| 44 | 167.480430 | AS | 0.999440 | AIR | 1.00000000 | 88.650 |
| 45 | 116.813879 | | 29.633926 | CAF2 | 1.50185255 | 79.972 |
| 46 | 176.434975 | AS | 0.996811 | AIR | 1.00000000 | 66.214 |
| 47 | 99.243782 | | 50.572086 | SIO2 | 1.56078570 | 57.873 |
| 48 | 0.000000 | | 1.996512 | HIINDEX1 | 1.59667693 | 19.284 |
| 49 | 0.000000 | | 0.000000 | AIR | 0.00000000 | 17.001 |

TABLE 6A

Aspheric Constants

| | SRF | | | | |
|---|---|---|---|---|---|
| | 2 | 5 | 9 | 10 | 13 |
| K | 0 | 0 | 0 | 0 | 0 |
| C1 | −1.555531e−09 | 1.687918e−08 | 1.687918e−08 | −1.348504e−09 | 7.573604e−10 |
| C2 | −6.958515e−14 | 6.232575e−13 | 6.232575e−13 | −3.176568e−15 | −3.870838e−13 |
| C3 | −1.242060e−17 | 9.529592e−18 | 9.529592e−18 | −6.759196e−18 | 2.190326e−18 |
| C4 | 1.389350e−20 | 1.573173e−21 | 1.573173e−21 | 1.871932e−22 | 1.172042e−22 |
| C5 | 1.251086e−25 | −2.114196e−25 | −2.114196e−25 | −1.231992e−26 | −4.121126e−27 |
| C6 | 4.509880e−29 | 1.902556e−29 | 1.902556e−29 | −2.072031e−31 | 3.470805e−32 |
| C7 | 0.000000e+00 | 0.000000e+00 | 0.000000e+00 | 0.000000e+00 | 0.000000e+00 |
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

| | SRF | | | | |
|---|---|---|---|---|---|
| | 18 | 19 | 23 | 27 | 42 |
| K | 0 | 0 | 0 | 0 | 0 |
| C1 | 2.849121e−08 | 3.066437e−08 | −1.429500e−07 | −9.011286e−09 | 1.649069e−08 |
| C2 | −2.278306e−13 | −7.961198e−14 | −2.394790e−12 | 1.443716e−13 | −2.040459e−13 |
| C3 | −8.088020e−18 | 4.912301e−19 | 4.129786e−17 | −2.416742e−18 | −1.139128e−18 |
| C4 | 1.085216e−21 | 2.365625e−21 | −5.098269e−21 | 1.150323e−22 | 4.785396e−22 |
| C5 | −3.346165e−26 | −1.010997e−25 | −1.337613e−25 | −2.653658e−26 | −1.860374e−26 |
| C6 | 4.803561e−31 | 2.034614e−30 | −3.296337e−29 | 6.716032e−32 | 4.389813e−31 |
| C7 | 0.000000e+00 | 0.000000e+00 | 0.000000e+00 | 0.000000e+00 | 0.000000e+00 |
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

| | SRF | |
|---|---|---|
| | 44 | 46 |
| K | 0 | 0 |
| C1 | −6.517109e−09 | 7.951924e−08 |
| C2 | −5.411899e−13 | 5.625967e−12 |
| C3 | 9.933771e−17 | −8.187722e−16 |
| C4 | 6.592214e−21 | 5.591368e−20 |
| C5 | 1.596683e−25 | −1.663052e−23 |
| C6 | −4.426984e−30 | 1.270531e−27 |
| C7 | 0.000000e+00 | 0.000000e+00 |
| C8 | 0.000000e+00 | 0.000000e+00 |
| C9 | 0.000000e+00 | 0.000000e+00 |

TABLE 7

| Surface | Radius | | Thickness | Material | Index 193.368 nm | Semidiameter |
|---|---|---|---|---|---|---|
| 1 | −140.823672 | AS | 57.433959 | SIO2 | 1.56078570 | 85.179 |
| 2 | −204.756037 | | 1.827474 | AIR | 1.00000000 | 106.319 |
| 3 | 239.453106 | | 66.012931 | SIO2 | 1.56078570 | 126.931 |
| 4 | −836.638684 | | 1.982704 | AIR | 1.00000000 | 125.824 |
| 5 | 1797.059677 | | 14.713179 | SIO2 | 1.56078570 | 123.061 |
| 6 | 4149.711621 | | 2.799289 | AIR | 1.00000000 | 121.381 |
| 7 | 340.970653 | | 31.938127 | SIO2 | 1.56078570 | 117.054 |
| 8 | −1898.815009 | AS | 204.027732 | AIR | 1.00000000 | 113.970 |
| 9 | −155.329952 | | 13.309745 | SIO2 | 1.56078570 | 72.590 |

TABLE 7-continued

| Surface | Radius | | Thickness | Material | Index 193.368 nm | Semidiameter |
|---|---|---|---|---|---|---|
| 10 | −695.719352 | | 17.409035 | AIR | 1.00000000 | 85.602 |
| 11 | −243.893201 | AS | −17.409035 | REFL | 1.00000000 | 89.704 |
| 12 | −695.719352 | | −13.309745 | SIO2 | 1.56078570 | 89.028 |
| 13 | −155.329952 | | −179.734273 | AIR | 1.00000000 | 84.959 |
| 14 | −1318.535220 | AS | 456.277939 | REFL | 1.00000000 | 113.654 |
| 15 | −418.128785 | | −188.264797 | REFL | 1.00000000 | 268.689 |
| 16 | −460.678827 | | 110.821404 | REFL | 1.00000000 | 137.222 |
| 17 | 376.198743 | AS | 24.631702 | SIO2 | 1.56078570 | 98.837 |
| 18 | 123.411374 | | 80.569056 | AIR | 1.00000000 | 87.243 |
| 19 | −188.093003 | | 24.804534 | SIO2 | 1.56078570 | 91.133 |
| 20 | −451.680016 | | 1.621150 | AIR | 1.00000000 | 102.517 |
| 21 | 26469.639394 | | 16.715830 | SIO2 | 1.56078570 | 107.381 |
| 22 | 201.259280 | AS | 35.754201 | AIR | 1.00000000 | 118.111 |
| 23 | −1202.421670 | AS | 51.241370 | SIO2 | 1.56078570 | 128.186 |
| 24 | −322.482765 | AS | 8.795729 | AIR | 1.00000000 | 132.239 |
| 25 | 258.337599 | | 56.740990 | SIO2 | 1.56078570 | 153.219 |
| 26 | −12589.869567 | AS | 13.195369 | AIR | 1.00000000 | 150.978 |
| 27 | 324.459180 | AS | 45.773586 | SIO2 | 1.56078570 | 149.648 |
| 28 | −497.518575 | | 13.712710 | AIR | 1.00000000 | 149.967 |
| 29 | −376.404658 | | 13.085749 | SIO2 | 1.56078570 | 149.173 |
| 30 | −958.464185 | | 9.230241 | AIR | 1.00000000 | 151.496 |
| 31 | −728.292950 | | 28.695468 | SIO2 | 1.56078570 | 151.626 |
| 32 | −357.158659 | | 18.667769 | AIR | 1.00000000 | 152.581 |
| 33 | 0.000000 | | 0.000000 | AIR | 1.00000000 | 146.019 |
| 34 | 0.000000 | | −16.100683 | AIR | 1.00000000 | 146.019 |
| 35 | 484.354722 | | 22.103311 | SIO2 | 1.56078570 | 146.382 |
| 36 | 948.500644 | | 1.900326 | AIR | 1.00000000 | 145.547 |
| 37 | 333.774920 | | 49.314075 | SIO2 | 1.56078570 | 144.715 |
| 38 | −28057.399637 | AS | 0.998829 | AIR | 1.00000000 | 142.813 |
| 39 | 158.420364 | | 53.881706 | SIO2 | 1.56078570 | 116.975 |
| 40 | 581.967137 | AS | 0.998509 | AIR | 1.00000000 | 107.937 |
| 41 | 104.934453 | | 41.887014 | SIO2 | 1.56078570 | 81.972 |
| 42 | 167.465131 | AS | 0.995522 | AIR | 1.00000000 | 63.820 |
| 43 | 93.083837 | | 53.858695 | HIINDEX1 | 1.78568015 | 56.852 |
| 44 | 0.000000 | | 1.000000 | WATER | 1.43667693 | 20.140 |
| 45 | 0.000000 | | 0.000000 | AIR | 0.00000000 | 18.001 |

TABLE 7A

Aspheric Constants

| | SRF | | | | |
|---|---|---|---|---|---|
| | 1 | 8 | 11 | 14 | 17 |
| K | 0 | 0 | 0 | 0 | 0 |
| C1 | 5.957933e−08 | 2.481530e−08 | −5.109441e−09 | 2.044458e−12 | −2.109855e−08 |
| C2 | 1.983359e−12 | −2.106333e−13 | −1.514546e−13 | 6.373752e−14 | 9.955737e−14 |
| C3 | 1.201592e−16 | 2.160013e−17 | −6.120616e−18 | −1.152163e−18 | −3.652850e−17 |
| C4 | −2.700912e−23 | −4.839678e−22 | 2.313325e−22 | 7.638886e−23 | −1.097906e−21 |
| C5 | 6.082962e−25 | −5.713773e−27 | −2.633844e−26 | −3.033146e−27 | −6.959896e−27 |
| C6 | −2.642537e−29 | 8.881762e−31 | 6.276857e−31 | 6.643171e−32 | 8.723697e−30 |
| C7 | 0.000000e+00 | 0.000000e+00 | 0.000000e+00 | 0.000000e+00 | 0.000000e+00 |
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

| | SRF | | | | |
|---|---|---|---|---|---|
| | 22 | 23 | 24 | 26 | 27 |
| K | 0 | 0 | 0 | 0 | 0 |
| C1 | −5.654066e−09 | 5.468832e−08 | −1.993769e−08 | 3.512543e−08 | −3.999647e−08 |
| C2 | −1.931133e−12 | 1.076007e−13 | 3.867690e−13 | −5.639458e−13 | −6.709900e−19 |
| C3 | −2.481208e−17 | −3.892917e−17 | −1.570725e−17 | 3.892215e−18 | −1.456616e−17 |
| C4 | 5.232255e−21 | 6.516272e−22 | 3.297297e−22 | −1.923201e−22 | 2.347099e−23 |
| C5 | −2.111625e−25 | 6.792876e−27 | 1.949532e−27 | 6.195980e−27 | 2.220410e−28 |
| C6 | 2.849533e−30 | −4.282052e−31 | −5.752876e−31 | −1.678071e−31 | −1.672158e−31 |
| C7 | 0.000000e+00 | 0.000000e+00 | 0.000000e+00 | 0.000000e+00 | 0.000000e+00 |
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

TABLE 7A-continued

Aspheric Constants

| | SRF | | |
|---|---|---|---|
| | 38 | 40 | 42 |
| K | 0 | 0 | 0 |
| C1 | −6.766738e−09 | −4.193986e−12 | 1.257645e−07 |
| C2 | −7.368953e−13 | 1.352189e−12 | 8.654450e−12 |
| C3 | 1.596358e−17 | −6.097321e−17 | 2.916255e−16 |
| C4 | 3.936995e−22 | 5.969746e−21 | −1.206138e−19 |
| C5 | −1.883310e−26 | −3.255779e−25 | 4.057293e−23 |
| C6 | 2.137685e−31 | 9.856534e−30 | −5.471715e−27 |
| C7 | 0.000000e+00 | 0.000000e+00 | 0.000000e+00 |
| C8 | 0.000000e+00 | 0.000000e+00 | 0.000000e+00 |
| C9 | 0.000000e+00 | 0.000000e+00 | 0.000000e+00 |

TABLE 8

| Surface | Radius | | Thickness | Material | Index 193.368 nm | Semidiameter |
|---|---|---|---|---|---|---|
| 1 | −139.939073 | AS | 56.668455 | SIO2 | 1.56078570 | 84.946 |
| 2 | −204.568615 | | 1.070135 | AIR | 1.00000000 | 105.840 |
| 3 | 239.096072 | | 65.121557 | SIO2 | 1.56078570 | 125.956 |
| 4 | −692.798796 | | 1.571173 | AIR | 1.00000000 | 125.004 |
| 5 | 1957.346368 | | 13.080686 | SIO2 | 1.56078570 | 121.787 |
| 6 | 1439.865663 | | 2.096708 | AIR | 1.00000000 | 119.718 |
| 7 | 353.510947 | | 31.616914 | SIO2 | 1.56078570 | 116.673 |
| 8 | −1227.690426 | AS | 203.390504 | AIR | 1.00000000 | 114.118 |
| 9 | −157.037999 | | 13.053495 | SIO2 | 1.56078570 | 71.933 |
| 10 | −687.975180 | | 17.007176 | AIR | 1.00000000 | 84.503 |
| 11 | −243.140860 | AS | −17.007176 | REFL | 1.00000000 | 88.550 |
| 12 | −687.975180 | | −13.053495 | SIO2 | 1.56078570 | 87.923 |
| 13 | −157.037999 | | −180.045623 | AIR | 1.00000000 | 84.148 |
| 14 | −1229.260994 | AS | 456.822311 | REFL | 1.00000000 | 112.739 |
| 15 | −415.881540 | | −187.469556 | REFL | 1.00000000 | 269.993 |
| 16 | −461.273571 | | 110.622049 | REFL | 1.00000000 | 138.437 |
| 17 | 416.369746 | AS | 22.657139 | SIO2 | 1.56078570 | 99.312 |
| 18 | 127.343817 | | 81.525715 | AIR | 1.00000000 | 87.994 |
| 19 | −175.649639 | | 25.205390 | SIO2 | 1.56078570 | 91.038 |
| 20 | −395.046607 | | 1.723874 | AIR | 1.00000000 | 102.252 |
| 21 | 4752.102432 | | 17.551743 | SIO2 | 1.56078570 | 107.514 |
| 22 | 207.928243 | AS | 36.620857 | AIR | 1.00000000 | 116.600 |
| 23 | −847.913584 | AS | 53.064053 | SIO2 | 1.56078570 | 122.858 |
| 24 | −317.558108 | AS | 10.132654 | AIR | 1.00000000 | 129.865 |
| 25 | 262.792389 | | 55.215589 | SIO2 | 1.56078570 | 153.298 |
| 26 | −12429.722386 | AS | 14.874464 | AIR | 1.00000000 | 151.228 |
| 27 | 331.657900 | AS | 47.885282 | SIO2 | 1.56078570 | 151.049 |
| 28 | −521.198576 | | 15.157977 | AIR | 1.00000000 | 151.375 |
| 29 | −364.704682 | | 13.335942 | SIO2 | 1.56078570 | 150.764 |
| 30 | −913.671559 | | 10.373584 | AIR | 1.00000000 | 153.606 |
| 31 | −747.508150 | | 29.699750 | SIO2 | 1.56078570 | 153.896 |
| 32 | −353.767343 | | 16.584736 | AIR | 1.00000000 | 154.899 |
| 33 | 0.000000 | | 0.000000 | AIR | 1.00000000 | 148.746 |
| 34 | 0.000000 | | −15.584916 | AIR | 1.00000000 | 148.746 |
| 35 | 467.578029 | | 23.532973 | SIO2 | 1.56078570 | 149.243 |
| 36 | 1013.533552 | | 1.802113 | AIR | 1.00000000 | 148.398 |
| 37 | 320.005819 | | 51.463273 | SIO2 | 1.56078570 | 147.084 |
| 38 | −62373.538118 | AS | 1.172411 | AIR | 1.00000000 | 144.920 |
| 39 | 166.275527 | | 53.143323 | SIO2 | 1.56078570 | 118.761 |
| 40 | 678.286117 | AS | 0.999760 | AIR | 1.00000000 | 109.694 |
| 41 | 105.898192 | | 40.733496 | SIO2 | 1.56078570 | 82.526 |
| 42 | 182.630168 | AS | 1.149050 | AIR | 1.00000000 | 66.139 |
| 43 | 95.822380 | | 55.466141 | HIINDEX1 | 1.76018665 | 57.704 |
| 44 | 0.000000 | | 0.000000 | AIR | 0.00000000 | 18.001 |

TABLE 8A

Aspheric Constants

| | SRF | | | | |
|---|---|---|---|---|---|
| | 1 | 8 | 11 | 14 | 17 |
| K | 0 | 0 | 0 | 0 | 0 |
| C1 | 6.029618e−08 | 2.414888e−08 | −4.778400e−09 | 1.245817e−11 | −1.786350e−08 |

TABLE 8A-continued

Aspheric Constants

| | | | | | |
|---|---|---|---|---|---|
| C2 | 1.977400e−12 | −1.754153e−13 | −1.414883e−13 | 6.801196e−14 | 4.468447e−13 |
| C3 | 1.297306e−16 | 2.161869e−17 | −6.411452e−18 | −1.282692e−18 | −3.702082e−17 |
| C4 | −6.465162e−23 | −3.688233e−22 | 3.571585e−22 | 7.748610e−23 | −4.404198e−22 |
| C5 | 6.063912e−25 | −1.968392e−26 | −4.048065e−26 | −2.938896e−27 | −5.584451e−26 |
| C6 | −2.830320e−29 | 1.221206e−30 | 1.379349e−30 | 6.278026e−32 | 7.546398e−30 |
| C7 | 0.000000e+00 | 0.000000e+00 | 0.000000e+00 | 0.000000e+00 | 0.000000e+00 |
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

SRF

| | 22 | 23 | 24 | 26 | 27 |
|---|---|---|---|---|---|
| K | 0 | 0 | 0 | 0 | 0 |
| C1 | −9.734986e−10 | 5.553906e−08 | −1.791098e−08 | 3.707823e−08 | −3.550387e−08 |
| C2 | −1.751323e−12 | 1.384318e−14 | 3.025582e−13 | −5.382312e−13 | −7.220978e−18 |
| C3 | −5.043265e−17 | −5.243875e−17 | −1.190211e−17 | 2.499773e−18 | −9.815037e−18 |
| C4 | 6.940058e−21 | 1.291553e−21 | 1.909715e−22 | 3.519276e−23 | 3.333902e−23 |
| C5 | −2.676941e−25 | −1.397101e−26 | 8.123766e−28 | 7.231639e−28 | 4.084565e−28 |
| C6 | 3.739931e−30 | 8.628659e−32 | −5.978842e−31 | −4.265017e−32 | −3.001149e−32 |
| C7 | 0.000000e+00 | 0.000000e+00 | 0.000000e+00 | 0.000000e+00 | 0.000000e+00 |
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

SRF

| | 38 | 40 | 42 |
|---|---|---|---|
| K | 0 | 0 | 0 |
| C1 | −3.626586e−09 | −9.602390e−12 | 1.015803e−07 |
| C2 | −7.527255e−13 | 1.622695e−12 | 5.897100e−12 |
| C3 | 1.554813e−17 | −8.497345e−17 | 6.155690e−17 |
| C4 | 3.433043e−22 | 6.501324e−21 | −8.118554e−20 |
| C5 | −1.684169e−26 | −3.034013e−25 | 2.357436e−23 |
| C6 | 1.922213e−31 | 8.528873e−30 | −3.368932e−27 |
| C7 | 0.000000e+00 | 0.000000e+00 | 0.000000e+00 |
| C8 | 0.000000e+00 | 0.000000e+00 | 0.000000e+00 |
| C9 | 0.000000e+00 | 0.000000e+00 | 0.000000e+00 |

TABLE 9

| Surface | Radius | | Thickness | Material | Index 193.368 nm | Semidiameter |
|---|---|---|---|---|---|---|
| 1 | −143.450651 | AS | 57.270855 | SIO2 | 1.56078570 | 85.095 |
| 2 | −206.795430 | | 0.999185 | AIR | 1.00000000 | 105.561 |
| 3 | 238.942349 | | 65.084734 | SIO2 | 1.56078570 | 124.717 |
| 4 | −715.681319 | | 1.922826 | AIR | 1.00000000 | 123.678 |
| 5 | 1969.861686 | | 13.486505 | SIO2 | 1.56078570 | 120.587 |
| 6 | 1956.232535 | | 2.085647 | AIR | 1.00000000 | 118.680 |
| 7 | 351.063566 | | 30.285116 | SIO2 | 1.56078570 | 115.287 |
| 8 | −1758.712740 | AS | 197.627466 | AIR | 1.00000000 | 112.682 |
| 9 | −158.482402 | | 13.019095 | SIO2 | 1.56078570 | 70.234 |
| 10 | −717.195376 | | 16.489522 | AIR | 1.00000000 | 82.406 |
| 11 | −242.835615 | AS | −16.489522 | REFL | 1.00000000 | 86.344 |
| 12 | −717.195376 | | −13.019095 | SIO2 | 1.56078570 | 85.836 |
| 13 | −158.482402 | | −177.629393 | AIR | 1.00000000 | 82.613 |
| 14 | −1324.014672 | AS | 455.015907 | REFL | 1.00000000 | 112.967 |
| 15 | −414.262835 | | −187.362305 | REFL | 1.00000000 | 267.779 |
| 16 | −458.612694 | | 107.716389 | REFL | 1.00000000 | 136.372 |
| 17 | 443.456477 | AS | 22.553628 | SIO2 | 1.56078570 | 98.289 |
| 18 | 127.177618 | | 83.061925 | AIR | 1.00000000 | 87.356 |
| 19 | −168.941635 | | 26.194208 | SIO2 | 1.56078570 | 90.922 |
| 20 | −368.163655 | | 2.172316 | AIR | 1.00000000 | 103.197 |
| 21 | 2411.489857 | | 17.733305 | SIO2 | 1.56078570 | 109.822 |
| 22 | 210.765543 | AS | 36.730354 | AIR | 1.00000000 | 118.951 |
| 23 | −831.909620 | AS | 53.167578 | SIO2 | 1.56078570 | 125.050 |
| 24 | −323.559346 | AS | 8.877188 | AIR | 1.00000000 | 131.662 |
| 25 | 261.636780 | | 54.578305 | SIO2 | 1.56078570 | 154.212 |
| 26 | −7451.510120 | AS | 11.673321 | AIR | 1.00000000 | 152.231 |
| 27 | 334.113467 | AS | 46.289599 | SIO2 | 1.56078570 | 151.745 |
| 28 | −521.440736 | | 15.564426 | AIR | 1.00000000 | 152.216 |
| 29 | −362.516258 | | 12.998369 | SIO2 | 1.56078570 | 151.706 |
| 30 | −885.661707 | | 9.199344 | AIR | 1.00000000 | 154.981 |
| 31 | −760.796527 | | 31.167725 | SIO2 | 1.56078570 | 155.373 |
| 32 | −354.924849 | | 21.266047 | AIR | 1.00000000 | 156.575 |

TABLE 9-continued

| Surface | Radius | | Thickness | Material | Index 193.368 nm | Semidiameter |
|---|---|---|---|---|---|---|
| 33 | 0.000000 | | 0.000000 | AIR | 1.00000000 | 150.737 |
| 34 | 0.000000 | | −19.909527 | AIR | 1.00000000 | 150.737 |
| 35 | 466.946915 | | 24.184506 | SIO2 | 1.56078570 | 151.060 |
| 36 | 1007.812349 | | 1.000089 | AIR | 1.00000000 | 150.208 |
| 37 | 327.655912 | | 52.259505 | SIO2 | 1.56078570 | 149.067 |
| 38 | 8559.973662 | AS | 1.008019 | AIR | 1.00000000 | 146.760 |
| 39 | 167.622816 | | 51.251662 | SIO2 | 1.56078570 | 120.228 |
| 40 | 755.582939 | AS | 0.998542 | AIR | 1.00000000 | 113.007 |
| 41 | 111.268305 | | 39.610904 | SIO2 | 1.56078570 | 85.238 |
| 42 | 208.057298 | AS | 0.994963 | AIR | 1.00000000 | 70.122 |
| 43 | 96.749104 | | 15.231814 | SIO2 | 1.56078570 | 60.010 |
| 44 | 82.457236 | | 42.900568 | HIINDEX1 | 1.74983027 | 48.300 |
| 45 | 0.000000 | | 0.000000 | AIR | 0.00000000 | 18.001 |

TABLE 9A

Aspheric Constants

| | SRF | | | | |
|---|---|---|---|---|---|
| | 1 | 8 | 11 | 14 | 17 |
| K | 0 | 0 | 0 | 0 | 0 |
| C1 | 6.544677e−08 | 2.162074e−08 | −5.239503e−09 | 1.092411e−10 | −2.331771e−08 |
| C2 | 1.806423e−12 | −3.031766e−13 | −1.579675e−13 | 6.350407e−14 | 5.772773e−13 |
| C3 | 1.297100e−16 | 2.869963e−17 | −7.844766e−18 | −1.193786e−18 | −4.477617e−17 |
| C4 | −2.621657e−24 | −4.280146e−22 | 4.623955e−22 | 7.117518e−23 | −1.454389e−22 |
| C5 | 7.019452e−25 | −2.494189e−26 | −5.077577e−26 | −2.571356e−27 | −7.846302e−26 |
| C6 | −2.854711e−29 | 1.410397e−30 | 1.577810e−30 | 5.313151e−32 | 7.773042e−30 |
| C7 | 0.000000e+00 | 0.000000e+00 | 0.000000e+00 | 0.000000e+00 | 0.000000e+00 |
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

| | SRF | | | | |
|---|---|---|---|---|---|
| | 22 | 23 | 24 | 26 | 27 |
| K | 0 | 0 | 0 | 0 | 0 |
| C1 | −2.745443e−09 | 5.504068e−08 | −1.908337e−08 | 3.813921e−08 | −3.744186e−08 |
| C2 | −1.430163e−12 | 7.749637e−14 | 3.534725e−13 | −5.922217e−13 | −2.137735e−18 |
| C3 | −5.862502e−17 | −5.302435e−17 | −1.382155e−17 | 2.502458e−18 | −1.196000e−17 |
| C4 | 6.728883e−21 | 1.267574e−21 | 2.208808e−22 | 2.824486e−23 | 3.236426e−23 |
| C5 | −2.451371e−25 | −1.082217e−26 | 3.523530e−28 | 1.545158e−28 | 1.843694e−28 |
| C6 | 3.279808e−30 | 1.089270e−31 | −6.086769e−31 | −4.369267e−32 | −6.628403e−32 |
| C7 | 0.000000e+00 | 0.000000e+00 | 0.000000e+00 | 0.000000e+00 | 0.000000e+00 |
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

| | SRF | | |
|---|---|---|---|
| | 38 | 40 | 42 |
| K | 0 | 0 | 0 |
| C1 | −3.844980e−09 | −3.398546e−12 | 9.454938e−08 |
| C2 | −8.880362e−13 | 1.531428e−12 | 5.457038e−12 |
| C3 | 1.651633e−17 | −8.128857e−17 | −2.777250e−17 |
| C4 | 4.940631e−22 | 6.519570e−21 | −5.706103e−20 |
| C5 | −2.154757e−26 | −3.129316e−25 | 1.580865e−23 |
| C6 | 2.371161e−31 | 8.388571e−30 | −1.897858e−27 |
| C7 | 0.000000e+00 | 0.000000e+00 | 0.000000e+00 |
| C8 | 0.000000e+00 | 0.000000e+00 | 0.000000e+00 |
| C9 | 0.000000e+00 | 0.000000e+00 | 0.000000e+00 |

TABLE 10

| Surface | Radius | | Thickness | Material | Index 193.368 nm | Semidiameter |
|---|---|---|---|---|---|---|
| 1 | −143.758671 | AS | 57.406768 | SIO2 | 1.56078570 | 85.023 |
| 2 | −191.747696 | | 1.160725 | AIR | 1.00000000 | 104.914 |
| 3 | 262.406876 | | 66.568396 | SIO2 | 1.56078570 | 121.885 |
| 4 | −660.446223 | | 2.956398 | AIR | 1.00000000 | 121.076 |
| 5 | 1807.942814 | | 13.827382 | SIO2 | 1.56078570 | 118.221 |

TABLE 10-continued

| Surface | Radius | | Thickness | Material | Index 193.368 nm | Semidiameter |
|---|---|---|---|---|---|---|
| 6 | 2860.322099 | | 2.763629 | AIR | 1.00000000 | 116.681 |
| 7 | 372.157874 | | 32.394269 | SIO2 | 1.56078570 | 113.548 |
| 8 | −5597.977799 | AS | 198.998515 | AIR | 1.00000000 | 110.172 |
| 9 | −161.056093 | | 13.111979 | SIO2 | 1.56078570 | 72.542 |
| 10 | −710.061926 | | 16.992176 | AIR | 1.00000000 | 85.045 |
| 11 | −245.005067 | AS | −16.992176 | REFL | 1.00000000 | 88.979 |
| 12 | −710.061926 | | −13.111979 | SIO2 | 1.56078570 | 88.381 |
| 13 | −161.056093 | | −178.456992 | AIR | 1.00000000 | 84.711 |
| 14 | −1269.813125 | AS | 456.743570 | REFL | 1.00000000 | 112.130 |
| 15 | −415.069093 | | −187.485062 | REFL | 1.00000000 | 265.291 |
| 16 | −455.335485 | | 106.779583 | REFL | 1.00000000 | 134.666 |
| 17 | 393.788910 | AS | 22.686347 | SIO2 | 1.56078570 | 97.923 |
| 18 | 126.775396 | | 82.399523 | AIR | 1.00000000 | 87.164 |
| 19 | −169.193381 | | 26.323032 | SIO2 | 1.56078570 | 90.623 |
| 20 | −374.448573 | | 2.507925 | AIR | 1.00000000 | 102.877 |
| 21 | 2687.188508 | | 17.800162 | SIO2 | 1.56078570 | 109.393 |
| 22 | 214.951760 | AS | 37.379156 | AIR | 1.00000000 | 118.556 |
| 23 | −782.900400 | AS | 53.764790 | SIO2 | 1.56078570 | 125.976 |
| 24 | −331.748589 | AS | 8.779472 | AIR | 1.00000000 | 132.976 |
| 25 | 263.534372 | | 53.789713 | SIO2 | 1.56078570 | 155.917 |
| 26 | −10091.465506 | AS | 11.694437 | AIR | 1.00000000 | 154.056 |
| 27 | 336.628180 | AS | 46.842179 | SIO2 | 1.56078570 | 153.605 |
| 28 | −524.036178 | | 16.083667 | AIR | 1.00000000 | 154.085 |
| 29 | −361.494925 | | 13.160214 | SIO2 | 1.56078570 | 153.588 |
| 30 | −887.600668 | | 7.655686 | AIR | 1.00000000 | 157.086 |
| 31 | −757.302512 | | 30.706439 | SIO2 | 1.56078570 | 157.410 |
| 32 | −356.228549 | | 20.569987 | AIR | 1.00000000 | 158.573 |
| 33 | 0.000000 | | 0.000000 | AIR | 1.00000000 | 153.024 |
| 34 | 0.000000 | | −19.570300 | AIR | 1.00000000 | 153.024 |
| 35 | 466.343801 | | 24.348330 | SIO2 | 1.56078570 | 153.460 |
| 36 | 1007.994113 | | 1.045023 | AIR | 1.00000000 | 152.646 |
| 37 | 327.911368 | | 52.702566 | SIO2 | 1.56078570 | 151.549 |
| 38 | 6644.997887 | AS | 1.030724 | AIR | 1.00000000 | 149.268 |
| 39 | 170.393057 | | 51.776105 | SIO2 | 1.56078570 | 122.801 |
| 40 | 713.133919 | AS | 1.221421 | AIR | 1.00000000 | 115.628 |
| 41 | 114.354690 | | 39.319232 | SIO2 | 1.56078570 | 87.759 |
| 42 | 217.249445 | AS | 1.502569 | AIR | 1.00000000 | 73.430 |
| 43 | 99.993745 | | 13.872371 | SIO2 | 1.56078570 | 62.621 |
| 44 | 81.034397 | | 36.208638 | HIINDEX1 | 1.75124600 | 51.110 |
| 45 | 0.000000 | | 5.000000 | SIO2 | 1.56078570 | 31.083 |
| 46 | 0.000000 | | 5.000000 | HIINDEX1 | 1.75124600 | 23.545 |
| 47 | 0.000000 | | 0.000000 | AIR | 0.00000000 | 18.001 |

TABLE 10A

Aspheric Constants

| | SRF | | | | |
|---|---|---|---|---|---|
| | 1 | 8 | 11 | 14 | 17 |
| K | 0 | 0 | 0 | 0 | 0 |
| C1 | 6.210399e−08 | 1.051314e−08 | −4.569414e−09 | −1.170452e−10 | −2.490154e−08 |
| C2 | 1.322671e−12 | −3.222083e−13 | −1.355497e−13 | 6.160782e−14 | 5.760576e−13 |
| C3 | 1.391370e−16 | 2.983455e−17 | −5.800270e−18 | −7.963399e−19 | −4.995261e−17 |
| C4 | −3.915352e−24 | −5.584427e−22 | 2.308879e−22 | 4.962774e−23 | 1.562080e−22 |
| C5 | 5.960542e−25 | −2.378406e−26 | −2.634160e−26 | −1.672115e−27 | −1.194410e−25 |
| C6 | −7.993263e−30 | 1.339901e−30 | 4.940167e−31 | 3.658240e−32 | 7.937623e−30 |
| C7 | 0.000000e+00 | 0.000000e+00 | 0.000000e+00 | 0.000000e+00 | 0.000000e+00 |
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

| | SRF | | | | |
|---|---|---|---|---|---|
| | 22 | 23 | 24 | 26 | 27 |
| K | 0 | 0 | 0 | 0 | 0 |
| C1 | −3.526126e−09 | 5.446621e−08 | −1.645252e−08 | 3.708765e−08 | −3.576180e−08 |
| C2 | −1.261634e−12 | 8.646900e−14 | 3.102803e−13 | −5.459169e−13 | −4.908192e−19 |
| C3 | −4.207319e−17 | −4.238433e−17 | −1.123332e−17 | 1.694357e−18 | −1.112975e−17 |
| C4 | 5.124669e−21 | 1.115885e−21 | 1.935408e−22 | 2.693408e−23 | 3.052683e−23 |
| C5 | −1.827823e−25 | −1.256788e−26 | 2.150379e−28 | 1.272051e−28 | −9.406336e−29 |
| C6 | 2.424527e−30 | 3.245209e−31 | −5.110521e−31 | −4.770036e−32 | −7.115777e−32 |
| C7 | 0.000000e+00 | 0.000000e+00 | 0.000000e+00 | 0.000000e+00 | 0.000000e+00 |

TABLE 10A-continued

Aspheric Constants

| | | | | | |
|---|---|---|---|---|---|
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

| | SRF | | |
|---|---|---|---|
| | 38 | 40 | 42 |
| K | 0 | 0 | 0 |
| C1 | −3.058277e−09 | −3.739153e−12 | 8.462131e−08 |
| C2 | −7.881241e−13 | 1.325294e−12 | 4.796560e−12 |
| C3 | 1.199448e−17 | −6.820514e−17 | −4.069007e−17 |
| C4 | 5.234460e−22 | 5.182324e−21 | −1.845363e−20 |
| C5 | −1.972629e−26 | −2.333482e−25 | 6.685841e−24 |
| C6 | 2.034018e−31 | 5.777182e−30 | −6.748719e−28 |
| C7 | 0.000000e+00 | 0.000000e+00 | 0.000000e+00 |
| C8 | 0.000000e+00 | 0.000000e+00 | 0.000000e+00 |
| C9 | 0.000000e+00 | 0.000000e+00 | 0.000000e+00 |

TABLE 11

| SRF | Radius | | Thickness | Material | Index 193.368 nm | Semidiam.. |
|---|---|---|---|---|---|---|
| 1 | −363.562869 | | 43.314952 | SIO2 | 1.56078570 | 88.757 |
| 2 | −190.552538 | AS | 2.163276 | AIR | 1.00000000 | 97.015 |
| 3 | 444.494588 | | 54.518871 | SIO2 | 1.56078570 | 104.913 |
| 4 | −189.396028 | | 147.375897 | AIR | 1.00000000 | 105.241 |
| 5 | −167.542007 | AS | 15.119789 | CAF2 | 1.50185255 | 53.592 |
| 6 | −1783.871595 | | 14.984449 | AIR | 1.00000000 | 64.000 |
| 7 | −212.048924 | | −14.984449 | REFL | 1.00000000 | 67.817 |
| 8 | −1783.871595 | | −15.119789 | CAF2 | 1.50185255 | 67.824 |
| 9 | −167.542007 | AS | −132.376727 | AIR | 1.00000000 | 67.499 |
| 10 | −4144.296360 | AS | 177.480135 | REFL | 1.00000000 | 91.762 |
| 11 | −1081.722900 | | 58.982873 | SIO2 | 1.56078570 | 150.472 |
| 12 | −230.182654 | | 0.997725 | AIR | 1.00000000 | 154.440 |
| 13 | −2745.872210 | AS | 40.203338 | SIO2 | 1.56078570 | 162.415 |
| 14 | −365.406997 | | 1.171374 | AIR | 1.00000000 | 164.562 |
| 15 | 660.444007 | | 26.539178 | SIO2 | 1.56078570 | 165.998 |
| 16 | 929.458283 | | 1.345953 | AIR | 1.00000000 | 164.441 |
| 17 | 197.977075 | | 53.302785 | SIO2 | 1.56078570 | 162.916 |
| 18 | 326.403722 | AS | 109.997010 | AIR | 1.00000000 | 153.978 |
| 19 | 381.962587 | AS | 15.209469 | SIO2 | 1.56078570 | 133.444 |
| 20 | 218.959915 | | 84.152560 | AIR | 1.00000000 | 125.121 |
| 21 | 157.386222 | | 65.954537 | SIO2 | 1.56078570 | 105.406 |
| 22 | 130.586858 | | 55.186424 | AIR | 1.00000000 | 81.465 |
| 23 | −219.213704 | AS | 12.992852 | SIO2 | 1.56078570 | 80.092 |
| 24 | 193.521199 | | 51.103600 | AIR | 1.00000000 | 86.111 |
| 25 | −202.267409 | | 64.379291 | SIO2 | 1.56078570 | 91.522 |
| 26 | −182.797467 | | 1.012504 | AIR | 1.00000000 | 116.600 |
| 27 | 759.119564 | AS | 13.528303 | SIO2 | 1.56078570 | 139.976 |
| 28 | 434.694511 | | 16.255534 | AIR | 1.00000000 | 146.202 |
| 29 | 803.267199 | | 66.374930 | SIO2 | 1.56078570 | 149.833 |
| 30 | −355.087707 | | 3.182081 | AIR | 1.00000000 | 154.931 |
| 31 | 1534.992497 | | 41.086853 | SIO2 | 1.56078570 | 164.988 |
| 32 | −659.025403 | | 33.311165 | AIR | 1.00000000 | 166.004 |
| 33 | 469.085216 | | 47.735231 | SIO2 | 1.56078570 | 166.006 |
| 34 | −2061.549181 | | −5.348879 | AIR | 1.00000000 | 164.561 |
| 35 | 0.000000 | | 0.000000 | AIR | 1.00000000 | 164.239 |
| 36 | 0.000000 | | 25.851690 | AIR | 1.00000000 | 164.239 |
| 37 | −553.529412 | | 12.998477 | SIO2 | 1.56078570 | 164.123 |
| 38 | −1487.266396 | | 1.056380 | AIR | 1.00000000 | 165.162 |
| 39 | 400.870395 | | 62.857908 | SIO2 | 1.56078570 | 164.885 |
| 40 | −775.884967 | | 0.994629 | AIR | 1.00000000 | 163.261 |
| 41 | 196.348406 | | 50.149979 | SIO2 | 1.56078570 | 133.827 |
| 42 | 872.082483 | AS | 0.999034 | AIR | 1.00000000 | 128.044 |
| 43 | 126.532527 | | 31.734400 | SIO2 | 1.56078570 | 98.487 |
| 44 | 171.258915 | AS | 0.998171 | AIR | 1.00000000 | 88.881 |
| 45 | 116.691632 | | 29.088808 | CAF2 | 1.50185255 | 80.089 |
| 46 | 168.659021 | AS | 0.998989 | AIR | 1.00000000 | 66.353 |
| 47 | 97.521146 | | 50.907207 | SIO2 | 1.56078570 | 58.235 |
| 48 | 0.000000 | | 1.996512 | WATER | 1.43667693 | 20.051 |
| 49 | 0.000000 | | 0.000000 | AIR | 0.00000000 | 17.001 |

TABLE 11A

Aspheric Constants

| | SRF | | | | |
|---|---|---|---|---|---|
| | 2 | 5 | 9 | 10 | 13 |
| K | 0 | 0 | 0 | 0 | 0 |
| C1 | −2.760578e−09 | 1.603489e−08 | 1.603489e−08 | −1.247159e−09 | 3.764876e−10 |
| C2 | −2.853441e−13 | 5.878412e−13 | 5.878412e−13 | −3.674242e−16 | −3.990105e−13 |
| C3 | −1.854842e−17 | 9.905237e−18 | 9.905237e−18 | −5.946353e−18 | 3.462113e−18 |
| C4 | 1.455974e−20 | 1.668823e−21 | 1.668823e−21 | 9.954063e−23 | 6.557756e−23 |
| C5 | 3.187482e−26 | −2.878194e−25 | −2.878194e−25 | −6.271000e−27 | −3.238969e−27 |
| C6 | 5.065923e−29 | 3.229224e−29 | 3.229224e−29 | −3.822302e−31 | 2.732583e−32 |

| | SRF | | | | |
|---|---|---|---|---|---|
| | 18 | 19 | 23 | 27 | 42 |
| K | 0 | 0 | 0 | 0 | 0 |
| C1 | 2.738495e−08 | 2.436036e−08 | −1.401150e−07 | −1.009245e−08 | 1.349777e−08 |
| C2 | −3.575547e−13 | −2.434773e−13 | −2.511241e−12 | 1.381857e−13 | −1.797461e−13 |
| C3 | −3.439165e−19 | 3.420924e−18 | 2.114608e−17 | −2.368525e−18 | −1.521933e−18 |
| C4 | 8.255803e−22 | 2.235015e−21 | −4.813119e−21 | 1.099057e−22 | 4.601109e−22 |
| C5 | −2.770099e−26 | −8.956199e−26 | −4.497879e−25 | −2.558985e−27 | −1.539741e−26 |
| C6 | 4.268336e−31 | 1.676039e−30 | −2.691902e−29 | 6.765261e−32 | 3.225484e−31 |

| | SRF | |
|---|---|---|
| | 44 | 46 |
| K | 0 | 0 |
| C1 | −3.924402e−09 | 8.340227e−08 |
| C2 | 8.630468e−14 | 4.003614e−12 |
| C3 | 1.193178e−16 | −6.361779e−16 |
| C4 | 8.227416e−21 | 3.754169e−22 |
| C5 | −2.859787e−25 | −6.830124e−24 |
| C6 | 2.158513e−29 | 8.494830e−28 |

TABLE 12

| SRF | Radius | | Thickness | Material | Index 193.368 nm | Semidiam. |
|---|---|---|---|---|---|---|
| 1 | −117.609115 | AS | 42.504552 | SIO2 | 1.56078570 | 82.223 |
| 2 | −177.038824 | | 1.228703 | AIR | 1.00000000 | 100.960 |
| 3 | 213.364626 | | 67.089304 | SIO2 | 1.56078570 | 127.440 |
| 4 | −547.449059 | | 1.056991 | AIR | 1.00000000 | 126.644 |
| 5 | 16244.721914 | | 12.999757 | SIO2 | 1.56078570 | 122.158 |
| 6 | 649.329131 | | 6.393295 | AIR | 1.00000000 | 118.074 |
| 7 | 716.539542 | | 21.519661 | SIO2 | 1.56078570 | 117.192 |
| 8 | −891.121831 | AS | 211.074110 | AIR | 1.00000000 | 115.493 |
| 9 | −161.155386 | | 13.128287 | SIO2 | 1.56078570 | 81.535 |
| 10 | −611.506316 | | 15.535604 | AIR | 1.00000000 | 87.295 |
| 11 | −236.127827 | AS | −15.535604 | REFL | 1.00000000 | 88.921 |
| 12 | −611.506316 | | −13.128287 | SIO2 | 1.56078570 | 87.062 |
| 13 | −161.155386 | | −191.071578 | AIR | 1.00000000 | 78.080 |
| 14 | −765.604468 | AS | 489.939909 | REFL | 1.00000000 | 97.935 |
| 15 | −414.218644 | | −194.485522 | REFL | 1.00000000 | 273.711 |
| 16 | −461.591091 | | 113.184572 | REFL | 1.00000000 | 137.119 |
| 17 | 292.697085 | AS | 13.007609 | SIO2 | 1.56078570 | 94.156 |
| 18 | 107.732392 | | 69.107843 | AIR | 1.00000000 | 82.930 |
| 19 | −151.983662 | | 23.402024 | SIO2 | 1.56078570 | 83.726 |
| 20 | −488.789850 | | 1.717184 | AIR | 1.00000000 | 96.444 |
| 21 | −28913.044218 | | 13.515647 | SIO2 | 1.56078570 | 100.924 |
| 22 | 191.919927 | AS | 31.978477 | AIR | 1.00000000 | 111.581 |
| 23 | −1067.055170 | AS | 43.571548 | SIO2 | 1.56078570 | 119.978 |
| 24 | −309.523406 | AS | 7.386175 | AIR | 1.00000000 | 124.389 |
| 25 | 262.769369 | | 57.656563 | SIO2 | 1.56078570 | 153.654 |
| 26 | −45785.112793 | AS | 26.346702 | AIR | 1.00000000 | 152.049 |
| 27 | 327.865485 | AS | 53.200757 | SIO2 | 1.56078570 | 153.196 |
| 28 | −490.867497 | | 15.569016 | AIR | 1.00000000 | 154.873 |
| 29 | −378.382439 | | 13.404211 | SIO2 | 1.56078570 | 154.857 |
| 30 | −940.264877 | | 12.530928 | AIR | 1.00000000 | 159.986 |
| 31 | −735.332053 | | 32.210701 | SIO2 | 1.56078570 | 161.214 |
| 32 | −353.930461 | | 23.507896 | AIR | 1.00000000 | 163.018 |
| 33 | 0.000000 | | 0.000000 | AIR | 1.00000000 | 162.367 |
| 34 | 0.000000 | | −22.444608 | AIR | 1.00000000 | 162.367 |

TABLE 12-continued

| SRF | Radius | | Thickness | Material | Index 193.368 nm | Semidiam. |
|---|---|---|---|---|---|---|
| 35 | 495.791214 | | 25.478789 | SIO2 | 1.56078570 | 163.005 |
| 36 | 1099.109773 | | 1.092964 | AIR | 1.00000000 | 162.533 |
| 37 | 327.887763 | | 59.191484 | SIO2 | 1.56078570 | 162.857 |
| 38 | −6035.878726 | AS | 0.997881 | AIR | 1.00000000 | 160.933 |
| 39 | 155.585955 | | 60.857823 | SIO2 | 1.56078570 | 128.682 |
| 40 | 502.556704 | AS | 0.994698 | AIR | 1.00000000 | 121.517 |
| 41 | 100.683802 | | 45.378701 | SIO2 | 1.56078570 | 87.346 |
| 42 | 259.320956 | AS | 0.989546 | AIR | 1.00000000 | 75.251 |
| 43 | 84.190909 | | 47.361435 | SIO2 | 1.56078570 | 57.516 |
| 44 | 0.000000 | | 1.000000 | WATER | 1.43667693 | 20.150 |
| 45 | 0.000000 | | 0.000000 | AIR | 0.00000000 | 18.001 |

TABLE 12A

Aspheric Constants

| | | | SRF | | |
|---|---|---|---|---|---|
| | 1 | 8 | 11 | 14 | 17 |
| K | 0 | 0 | 0 | 0 | 0 |
| C1 | 6.521334e−08 | 2.807890e−08 | −2.987383e−09 | −3.124994e−09 | −2.024087e−08 |
| C2 | 1.713047e−12 | −1.135339e−13 | −9.372427e−14 | 2.096585e−13 | 1.211841e−12 |
| C3 | 4.736329e−16 | 4.898650e−17 | −2.112133e−18 | −6.739512e−18 | 1.994882e−16 |
| C4 | −4.747266e−20 | −1.991503e−21 | 1.990133e−23 | 2.945523e−22 | −3.964237e−20 |
| C5 | 5.703360e−24 | 4.395448e−26 | −7.724934e−27 | −9.829910e−27 | 3.071839e−24 |
| C6 | −1.904358e−28 | 1.060646e−30 | 3.307276e−32 | 1.518811e−31 | −9.359990e−29 |

| | | | SRF | | |
|---|---|---|---|---|---|
| | 22 | 23 | 24 | 26 | 27 |
| K | 0 | 0 | 0 | 0 | 0 |
| C1 | −2.344946e−08 | 6.574907e−08 | −1.112698e−08 | 3.645338e−08 | −3.564504e−08 |
| C2 | −1.215056e−12 | 3.605980e−13 | 6.168355e−13 | −5.510982e−13 | 1.362785e−18 |
| C3 | −1.130529e−16 | −1.083503e−16 | −2.523969e−17 | 7.960300e−18 | −1.354328e−17 |
| C4 | 1.330694e−20 | 3.744156e−23 | −1.208201e−22 | −2.644142e−22 | 3.985355e−23 |
| C5 | −5.272948e−25 | 2.126697e−25 | −7.939671e−27 | 5.011928e−27 | −1.152577e−27 |
| C6 | 6.293611e−30 | −4.908894e−30 | −1.349927e−30 | −6.300745e−32 | −1.519852e−31 |

| | | SRF | |
|---|---|---|---|
| | 38 | 40 | 42 |
| K | 0 | 0 | 0 |
| C1 | 7.566945e−09 | −2.903055e−12 | 9.147070e−08 |
| C2 | −8.163086e−13 | 1.907885e−12 | 9.024229e−12 |
| C3 | 8.893793e−18 | −2.330647e−16 | −6.249869e−16 |
| C4 | 2.692862e−22 | 1.789661e−20 | 3.018462e−20 |
| C5 | −7.162666e−27 | −6.737730e−25 | 2.430882e−24 |
| C6 | 4.921956e−32 | 1.119864e−29 | −6.583230e−28 |

TABLE 13

| Tab./FIG | $D_{max}$ | Y' | NA | $N_L$ | $N_{OP}$ | COMP1 | COMP2 | COMP3 |
|---|---|---|---|---|---|---|---|---|
| 3 | 332 | 17 | 1.2 | 21 | 2 | 13.56 | 284.80 | 142.40 |
| 4 | 331.2 | 17 | 1.2 | 22 | 2 | 13.53 | 297.65 | 148.82 |
| 5 | 332 | 17 | 1.2 | 21 | 2 | 13.56 | 284.80 | 142.40 |
| 6 | 332 | 17 | 1.2 | 21 | 2 | 13.56 | 284.80 | 142.40 |
| 7 | 305 | 18 | 1.3 | 18 | 2 | 10.03 | 180.47 | 90.24 |
| 8 | 310 | 18 | 1.3 | 18 | 2 | 10.19 | 183.43 | 91.72 |
| 9 | 313 | 18 | 1.3 | 18 | 2 | 10.29 | 185.21 | 92.60 |
| 10 | 317 | 18 | 1.3 | 19 | 2 | 10.42 | 197.99 | 99.00 |
| 11 | 332 | 17 | 1.2 | 21 | 2 | 13.56 | 284.80 | 142.40 |
| 12 | 326 | 18 | 1.3 | 18 | 2 | 10.72 | 192.90 | 96.45 |

The invention claimed is:

1. A projection objective for imaging a pattern arranged in an object surface of the projection objective onto an image surface of the projection objective using ultraviolet radiation, the projection objective comprising:

a plurality of optical elements including transparent optical elements transparent for radiation at an operating wavelength λ, where 260 nm>λ>150 nm;

an image-side pupil surface being the pupil surface closest to the image surface; and an aperture-defining lens group arranged between the image-side pupil surface and the image surface for converging radiation coming from the image-side pupil surface towards the image surface to define an image-side numerical aperture NA, where 0.7≦NA≦1.4; wherein:

the aperture-defining lens group comprises a high-index lens made from a transparent high-index material having a refractive index $n_{HI}$, where $n_{HI}$>$n_{SIO2}$, where $n_{SIO2}$ is the refractive index of silicon dioxide (SiO₂) at the operating wavelength, the high-index material is a solid material, and
the solid material is magnesium aluminum oxide ($MgAl_2O_4$, spinell).

2. Projection objective according to claim 1, wherein the high-index material has a refractive index $n_{HI}>1.6$ at the operating wavelength.

3. A projection objective for imaging a pattern arranged in an object surface of the projection objective onto an image surface of the projection objective using ultraviolet radiation, the projection objective comprising:
a plurality of optical elements including transparent optical elements transparent for radiation at an operating wavelength λ, where 260 nm>λ>150 nm;
an image-side pupil surface being the pupil surface closest to the image surface; and
an aperture-defining lens group arranged between the image-side pupil surface and the image surface for converging radiation coming from the image-side pupil surface towards the image surface to define an image-side numerical aperture NA, where $0.7 \leq NA \leq 1.4$; wherein:
the aperture-defining lens group comprises a high-index lens made from a transparent high-index material having a refractive index $n_{HI}$, where $n_{HI}>n_{SIO2}$, where $n_{SIO2}$ is the refractive index of silicon dioxide ($SiO_2$) at the operating wavelength,
the high-index material is a solid material, and
the aperture-defining lens group further comprises a liquid high-index material having a refractive index $n_{HI}>1.6$.

4. Projection objective according to claim 3, wherein the liquid material is chosen from the group consisting of cyclic hydrocarbons and water doped by at least one dopant increasing the refractive index of water.

5. A projection objective for imaging a pattern arranged in an object surface of the projection objective onto an image surface of the projection objective using ultraviolet radiation, the projection objective comprising:
a plurality of optical elements including transparent optical elements transparent for radiation at an operating wavelength λ, where 260 nm>λ>150 nm;
an image-side pupil surface being the pupil surface closest to the image surface; and
an aperture-defining lens group arranged between the image-side pupil surface and the image surface for converging radiation coming from the image-side pupil surface towards the image surface to define an image-side numerical aperture NA, where $0.7 \leq NA \leq 1.4$; wherein:
the aperture-defining lens group comprises a high-index lens made from a transparent high-index material having a refractive index $n_{HI}$, where $n_{HI}>n_{SIO2}$, where $n_{SIO2}$ is the refractive index of silicon dioxide ($SiO_2$) at the operating wavelength,
the high-index material is a solid material,
the aperture-defining lens group further comprises a liquid high-index lens having positive or negative refractive power,
the liquid high-index lens is confined between an object-side bordering element and an image-side bordering element,
the liquid high-index lens is formed of a high-index liquid that is transparent to radiation at the operating wavelength, and
the liquid high-index lens has a refractive index that is greater than the refractive index of silicon dioxide ($SiO_2$) at the operating wavelength.

6. Projection objective according to claim 5, wherein the object-side bordering element is a last solid optical element of the projection objective and the image-side bordering element is a substrate to be exposed.

7. Projection objective according to claim 5, wherein the object-side bordering element and the image-side bordering element are formed by transparent optical elements of the projection objective such that the projection objective includes at least one liquid lens formed at a position spaced apart from the image surface of the projection objective.

8. Projection objective according to claim 5, wherein at least one of the bordering elements adjacent to the liquid lens has a refractive index which is close to the refractive index of the high-index liquid forming the liquid lens, where the condition $\Delta n \leq 0.04$ applies for the refractive index difference $\Delta n$ between the refractive indexes of the bordering element and the liquid lens.

9. Projection objective according to claim 5, wherein the object-side bordering element adjacent to a high-index liquid lens is a lens having positive refractive power.

10. Projection objective according to claim 1, wherein the high-index lens is arranged optically close to the image surface where a marginal ray height is less than 50% of the marginal ray height at the image-side pupil surface.

11. Projection objective according to claim 1, wherein a material in contact with a substrate to be exposed or positioned closest to the substrate to be exposed is one of:
a liquid high-index material lens, where the liquid high-index lens has a refractive index that is greater than the refractive index of silicon dioxide ($SiO_2$) at the operating wavelength, and
the high-index material made from the solid material.

12. Projection objective according to claim 1, wherein the aperture-defining lens group includes exactly three aspheric lens surfaces.

13. Projection objective according to claim 1, wherein the aperture-defining lens group includes exactly three lenses having an aspherical lens surface.

14. Projection objective according to claim 12, wherein the aspheric lens surfaces are formed on concave lens surfaces.

15. Projection objective according to claim 14, wherein the concave lens surfaces are positioned on the image-side of an aspheric lens.

16. Projection objective according to claim 1, including a number $N_{ASP}$ of aspheric lens surfaces and a number $N_{ASPL}$ of lenses having at least one aspheric lens surface, wherein the condition AR>1 holds for the asphere ratio $AR=N_{ASP}/N_{ASPL}$.

17. Projection objective according to claim 1, wherein at least one double asphere having two aspherical surfaces directly following each other along an optical path is present within the projection objective.

18. Projection objective according to claim 17, wherein the double asphere is formed by facing aspherical surfaces of two separate, neighboring optical elements in a lens/lens or lens/mirror configuration.

19. Projection objective according to claim 17, wherein the double asphere is formed by a double aspherical lens having two lens surfaces designed as aspherical surfaces.

20. A projection objective for imaging a pattern arranged in an object surface of the projection objective onto an image surface of the projection objective using ultraviolet radiation, the projection objective comprising:
a plurality of optical elements including transparent optical elements transparent for radiation at an operating wavelength λ, where 260 nm>λ>150 nm;
an image-side pupil surface being the pupil surface closest to the image surface;
an aperture-defining lens group arranged between the image-side pupil surface and the image surface for converging radiation coming from the image-side pupil surface towards the image surface to define an image-side numerical aperture NA, where $0.7 \leq NA \leq 1.4$; and at least one triple asphere having three immediately consecutive aspherical surfaces, wherein:

the aperture-defining lens group comprises a high-index lens made from a transparent high-index material having a refractive index $n_{HI}$, where $n_{HI} > n_{SIO2}$, where $n_{SIO2}$ is the refractive index of silicon dioxide ($SiO_2$) at the operating wavelength, and the high-index material is a solid material.

21. Projection objective according to claim 1, wherein the aperture-defining lens group is designed to define an image-side numerical aperture NA, where $1.2 \leq NA \leq 1.4$ in conjunction with an immersion medium.

22. A catadioptric projection objective for imaging a pattern arranged in an object surface of the projection objective onto an image surface of the projection objective using ultraviolet radiation, the projection objective comprising:

a first objective part for imaging the pattern on the object surface onto a first intermediate image;

a second objective part for imaging an intermediate image onto the image surface, a plurality of optical elements including transparent optical elements transparent for radiation at an operating wavelength $\lambda$, where $260 \text{ nm} > \lambda > 150 \text{ nm}$;

an image-side pupil surface being the pupil surface closest to the image surface;

an aperture-defining lens group arranged between the image-side pupil surface and the image surface for converging radiation coming from the image-side pupil surface towards the image surface to define an image-side numerical aperture NA, where $0.7 \leq NA \leq 1.4$; and at least one negative lens arranged near or at the image-side pupil surface and having a lens diameter $D_{NL}$ according to: $0.8 \leq D_{NL} \leq D_M$, where $D_M$ is the maximum diameter of lenses between a constriction region of smallest beam diameter in the second objective part and the image surface; wherein:

at least one of the objective parts includes at least one concave mirror, all optical elements of the projection objective, including refractive and reflective optical elements, share a common straight optical axis, the aperture-defining lens group comprises a high-index lens made from a transparent high-index material having a refractive index $n_{HI}$, where $n_{HI} > n_{SIO2}$, where $n_{SIO2}$ is the refractive index of silicon dioxide ($SiO_2$) at the operating wavelength, and the high-index material is a solid material.

23. Projection objective according to claim 22, wherein the second objective part is designed for imaging the first intermediate image onto the image surface such that the projection objective includes exactly one intermediate image.

24. Projection objective according to claim 23, wherein the second objective part is a refractive objective part.

25. Projection objective according to claim 23, wherein the second objective part is a catadioptric objective part including at least one concave mirror.

26. Projection objective according to claim 22, including at least one concave mirror positioned optically close to a pupil surface or at a pupil surface, where negative refractive power is arranged close to that concave mirror such that radiation directed at the concave mirror and radiation reflected from the concave mirror is influenced by negative refractive power.

27. Projection objective according to claim 22, wherein the negative lens is a negative meniscus lens having a concave surface facing the image surface.

28. Projection objective according to claim 1, wherein a distance $D_{PS-IS}$ between the image-side pupil surface and the image surface falls within a range $D_{PS-IS} \leq 0.18 * TT$, where TT is the axial distance between the object surface and the image surface.

29. Projection objective according to claim 22, having a maximum lens diameter $D_{max}$ and a maximum image field height Y', wherein $COMP1 = D_{max}/(Y' \cdot NA^2)$ and wherein $COMP1 < 15$.

30. Projection objective according to claim 29, having exactly two concave mirrors and wherein $COMP1 < 14$.

31. Projection objective according to claim 29, having exactly four concave mirrors and wherein $COMP1 < 12$.

* * * * *